(12) United States Patent
Sääski et al.

(10) Patent No.: US 11,088,066 B2
(45) Date of Patent: Aug. 10, 2021

(54) MULTILAYER STRUCTURE AND RELATED METHOD OF MANUFACTURE FOR ELECTRONICS

(71) Applicant: TactoTek Oy, Oulunsalo (FI)

(72) Inventors: Jarmo Sääski, Oulunsalo (FI); Mikko Heikkinen, Oulunsalo (FI); Tero Heikkinen, Oulunsalo (FI); Mika Paani, Oulunsalo (FI); Jan Tillonen, Oulunsalo (FI); Ronald Haag, Oulunsalo (FI)

(73) Assignee: TACTOTEK OY, Oulunsalo (FI)

( * ) Notice: Subject to any disclaimer, the term of this patent is extended or adjusted under 35 U.S.C. 154(b) by 238 days.

(21) Appl. No.: 15/924,697

(22) Filed: Mar. 19, 2018

(65) Prior Publication Data
US 2019/0287892 A1    Sep. 19, 2019

(51) Int. Cl.
*H05K 5/00* (2006.01)
*H01L 23/522* (2006.01)
(Continued)

(52) U.S. Cl.
CPC .......... *H01L 23/522* (2013.01); *H01L 23/145* (2013.01); *H01L 23/50* (2013.01);
(Continued)

(58) Field of Classification Search
CPC .. B60R 16/0239; H05K 5/0034; H05K 3/284; H05K 1/05; H05K 2203/1316;
(Continued)

(56) References Cited

U.S. PATENT DOCUMENTS 3,796,923 A * 3/1974 Johansson .............. H05K 3/202
174/72 R
4,150,863 A * 4/1979 Krafthefer ........... H01R 12/727
439/629
(Continued)

FOREIGN PATENT DOCUMENTS

DE    202016105563 U1    2/2017

OTHER PUBLICATIONS

International Search Report issued by the European Patent Office acting as the International Searching Authority in relation to International Application No. PCT/FI2019/050226 dated Jun. 24, 2019 (6 pages).
(Continued)

*Primary Examiner* — Mary A Wilczewski
*Assistant Examiner* — Tsz K Chiu
(74) *Attorney, Agent, or Firm* — Robert P. Michal, Esq.; Carter, DeLuca & Farrell LLP

(57) ABSTRACT

An integrated multilayer structure, includes a substrate film having a first side and an opposite second side. The substrate film includes electrically substantially insulating material, a circuit design including a number of electrically conductive areas of electrically conductive material on the first and/or second sides of the substrate film, and a connector including a number of electrically conductive contact elements. The connector is provided to the substrate film so that it extends to both the first and second sides of the substrate film and the number of electrically conductive contact elements connect to one or more of the conductive areas of the circuit design while being further configured to electrically couple to an external connecting element responsive to mating the external connecting element with the connector on the first or second side of or adjacent to the substrate film.

34 Claims, 16 Drawing Sheets

(51) Int. Cl.
*H01L 23/50* (2006.01)
*H05K 3/46* (2006.01)
*H01L 23/14* (2006.01)
*H01L 25/065* (2006.01)
*H05K 3/28* (2006.01)
*H05K 1/18* (2006.01)
*H05K 3/40* (2006.01)

(52) U.S. Cl.
CPC ......... *H01L 25/0657* (2013.01); *H05K 3/284* (2013.01); *H05K 3/4644* (2013.01); *H05K 1/184* (2013.01); *H05K 3/4046* (2013.01); *H05K 2201/09754* (2013.01); *H05K 2201/10189* (2013.01); *H05K 2201/10303* (2013.01); *H05K 2203/1316* (2013.01); *H05K 2203/1327* (2013.01)

(58) Field of Classification Search
CPC .... H05K 7/20854; H05K 1/142; H05K 7/026; H05K 3/202; H01R 2201/02; H01R 13/6658; H01R 43/205; H01Q 3/06
See application file for complete search history.

(56) References Cited

U.S. PATENT DOCUMENTS

| | | | | |
|---|---|---|---|---|
| 4,225,209 A * | 9/1980 | Hughes | ............. | H05K 7/14 439/344 |
| 4,533,202 A * | 8/1985 | Pohl | ............. | H01R 12/721 439/391 |
| 4,925,393 A * | 5/1990 | Ingalsbe | ............. | H01R 31/02 439/638 |
| 4,931,908 A * | 6/1990 | Boucard | ............. | H01L 23/5384 257/E23.174 |
| 4,968,260 A * | 11/1990 | Ingalsbe | ............. | H01R 31/06 439/638 |
| 5,169,343 A * | 12/1992 | Andrews | ............. | H01R 24/50 439/607.11 |
| 5,391,094 A * | 2/1995 | Kakinoki | ............. | H01R 31/06 361/679.4 |
| 5,564,949 A * | 10/1996 | Wellinsky | ............. | H01R 13/703 439/607.37 |
| 5,921,818 A * | 7/1999 | Larsen | ............. | H01R 13/6477 439/676 |
| 5,971,796 A * | 10/1999 | Duhr | ............. | H01R 13/516 439/364 |
| 5,984,690 A * | 11/1999 | Riechelmann | ............. | H01R 12/714 439/66 |
| 6,043,435 A * | 3/2000 | Yamaguchi | ............. | H01R 9/16 174/117 F |
| 6,117,292 A * | 9/2000 | Ahmad | ............. | G01N 27/414 204/416 |
| 6,238,237 B1 * | 5/2001 | Nagahata | ............. | H01R 12/79 439/493 |
| 6,431,884 B1 * | 8/2002 | Wallace | ............. | H05K 5/0034 439/86 |
| 6,445,350 B2 * | 9/2002 | Takenobu | ............. | H01Q 1/1271 343/713 |
| 6,445,592 B1 * | 9/2002 | Schirmer | ............. | B60R 16/0239 174/260 |
| 6,940,021 B2 * | 9/2005 | Pohl | ............. | H01H 9/10 174/137 R |
| 7,845,983 B2 * | 12/2010 | Kawada | ............. | H01R 13/6658 439/607.46 |
| 9,597,607 B2 * | 3/2017 | Bdeir | ............. | A63H 33/26 |
| 9,622,355 B2 * | 4/2017 | Stern | ............. | H01R 13/6658 |
| 2001/0012708 A1 * | 8/2001 | Mizuno | ............. | H05K 1/142 439/76.1 |
| 2004/0160731 A1 * | 8/2004 | Yamaguchi | ............. | H05K 3/284 361/600 |
| 2007/0184722 A1 * | 8/2007 | Doherty | ............. | A63H 33/086 439/638 |
| 2009/0125184 A1 | 5/2009 | Oakes | | |
| 2010/0263915 A1 * | 10/2010 | Shiraiwa | ............. | H05K 1/0201 174/252 |
| 2011/0059652 A1 * | 3/2011 | Hoyack | ............. | H01R 12/732 439/607.31 |
| 2012/0268864 A1 * | 10/2012 | Borowicz | ............. | H05K 5/0239 361/601 |
| 2013/0286606 A1 * | 10/2013 | Watanabe | ............. | H05K 7/1417 361/752 |
| 2014/0038466 A1 * | 2/2014 | Karodi | ............. | H01R 13/514 439/626 |
| 2014/0087586 A1 | 3/2014 | O'Connell et al. | | |
| 2018/0102601 A1 | 4/2018 | Baier et al. | | |

OTHER PUBLICATIONS

Written Opinion of the International Searching Authority issued by the European Patent Office acting as the International Searching Authority in relation to International Application No. PCT/FI2019/050226 dated Jun. 24, 2019 (6 pages).

* cited by examiner

200

300

MULTILAYER STRUCTURE AND RELATED METHOD OF MANUFACTURE FOR ELECTRONICS

The project leading to this application has received funding from the European Union's Horizon 2020 research and innovation program under grant agreement No 725076.

FIELD OF THE INVENTION

Generally the present invention relates to electronics, associated devices, structures and methods of manufacture. In particular, however not exclusively, the present invention concerns provision of external electrical connection to the internals of a functional structure containing a film layer and adjacent molded plastics layer integrated together.

BACKGROUND

There exists a variety of different stacked assemblies and structures in the context of electronics and electronic products.

The motivation behind the integration of electronics and related products may be as diverse as the related use contexts. Relatively often size savings, weight savings, cost savings, or just efficient integration of components is sought for when the resulting solution ultimately exhibits a multilayer nature. In turn, the associated use scenarios may relate to product packages or food casings, visual design of device housings, wearable electronics, personal electronic devices, displays, detectors or sensors, vehicle interiors, antennae, labels, vehicle electronics, etc.

Electronics such as electronic components, ICs (integrated circuit), and conductors, may be generally provided onto a substrate element by a plurality of different techniques. For example, ready-made electronics such as various surface mount devices (SMD) may be mounted on a substrate surface that ultimately forms an inner or outer interface layer of a multilayer structure. Additionally, technologies falling under the term "printed electronics" may be applied to actually produce electronics directly and additively to the associated substrate. The term "printed" refers in this context to various printing techniques capable of producing electronics/electrical elements from the printed matter, including but not limited to screen printing, flexography, and inkjet printing, through a substantially additive printing process. The used substrates may be flexible and printed materials organic, which is however, not always the case.

When a multilayer structure is loaded with various electronics, it may not always function completely in isolation, i.e. autonomously. Instead; various power, data and/or control connections may have to be provided, or are at least preferably provided, e.g. occasionally upon particular need, thereto, which typically requires provision of electrical connectors and related wiring or generally conductive elements even though also wireless connections may be applicable as well in some scenarios.

The concept of injection molded structural electronics (IMSE) actually involves building functional devices and parts therefor in the form of a multilayer structure, which encapsulates electronic functionality as seamlessly as possible. Characteristic to IMSE is also that the electronics is commonly manufactured into a true 3D (non-planar) form in accordance with the 3D models of the overall target product, part or generally design. To achieve desired 3D layout of electronics on a 3D substrate and in the associated end product, the electronics may be still provided on an initially planar substrate, such as a film, using two dimensional (2D) methods of electronics assembly, whereupon the substrate, already accommodating the electronics, may be formed into a desired three-dimensional, i.e. 3D, shape and subjected to overmolding, for example, by suitable plastic material that covers and embeds the underlying elements such as electronics, thus protecting and potentially hiding the elements from the environment.

Commonly, wired or generally contact-based electrical connections between the environment and the embedded electronics of a stacked, multilayer type, structure are provided at a side edge of the structure so that the necessary external wiring is brought into contact with a connector or other contact element that is located at, and potentially protrudes out from, the structure at a periphery thereof. However, in many use scenarios such configuration of connectors and external wiring is sub-optimum, because it easily puts additional constraints on the dimensioning and positioning of related host structures and components, not forgetting the features and manufacturing of the multilayer structure itself.

Yet, in various available connection methods visual artifacts or generally visual effects arising from a connection arrangement have been problematic, especially in applications where the concerned multilayer structure has been exposed to use environment and users with e.g. certain, potentially high expectations regarding the appearance and aesthetics of the product. For instance, in the context of transparent or translucent stacked structures, which may have been further lit by light sources such as LEDs, surface defects, inconsistencies and also the appearance in general affected by the connection elements have caused additional glitches from both aesthetic and functional (e.g. in terms of light management) standpoints.

Still, many current connection methods used in multilayer structures suffer from different durability and reliability issues e.g. in the context of use scenarios where the structures and connections thereof are subjected to stress caused by external forces such as bending or torsion forces, and further limit the configuration of stacked design in terms of e.g. number of electrically active layers and further layers such as molded layers.

SUMMARY aN objective of the present invention is to at least alleviate one or more of the above drawbacks associated with the existing solutions in the context of integral multilayer structures and electronics embedded therein.

The afore-mentioned objective is achieved with various embodiments of a multilayer structure and related method of manufacture in accordance with the present invention.

According to one embodiment of the present invention, an integrated multilayer structure suitable for use with an electronic device, comprises a (first) substrate film having a first side and an opposite second side, also with reference to corresponding first and second surfaces of the film, said substrate film comprising electrically substantially insulating material, a circuit design comprising a number of electrically conductive areas of electrically conductive material, optionally defining contact pads and/or elongated conductor traces, preferably printed by printed electronics technology, on said first and/or second sides of the substrate film, said circuit design optionally further comprising a number of electronic components such as mounted and/or printed components electrically connected to one or more of the number of electrically conductive areas, a connector, optionally comprising a pin or box header, said connector comprising a number of electrically conductive contact elements, the connector being provided to the substrate film, preferably through it, so that the connector extends to both said first and second sides of said substrate film and the number of electrically conductive contact elements connect to one or more of the conductive areas of the circuit design while being further configured to electrically couple to an external connecting element responsive to mating the external connecting element with the integral connector on said first or second side of or adjacent to the substrate film, and at least one plastic layer, preferably comprising thermoplastic material, molded onto said first and/or second side of the substrate film so as to at least partially cover the connector and enhance securing of the integral connector to the substrate film.

In preferred embodiments, as alluded to above, a portion of the connector is provided physically through the substrate film, e.g. a via at least one hole therein. Additionally or alternatively, at least one feature of the connector may define a connecting bridge or similar structure between the opposing sides of the substrate, extending from one side over the edge of the substrate to the other side. Thus the connector may be provided at least functionally, preferably including physically, through the substrate film, depending on the embodiment. Indeed, different embodiments for implementing the connector are discussed in more detail hereinafter.

In various embodiments, the aforementioned (thermo) plastic material may be configured to substantially fully cover the connector on a side of the substrate receiving the molded material thereon. However, a portion of the connector that is located on the opposing side of the substrate, and/or adjacent to the substrate, may remain at least partially free from the molded material, for example.

Yet, the aforesaid external connecting element may refer to whatever feasible connecting feature of an external structure, external device or external system to be connected with the multilayer structure suggested herein via the connector. Such connecting element or generally connection may include e.g. a (rigid) connector, flex cable, flex circuit or flex circuit board, contact pin(s), contact pad(s), solder connection, soldering to a circuit board, conductive adhesive such as epoxy or glue, crimp connection, welding, etc.

In various additional or supplementary embodiments, the circuit design further comprises a number of electronic components such as mounted and/or printed components at least electrically connected to one or more of the number of electrically conductive areas.

In various additional or supplementary embodiments, the circuit design further comprises a connecting component, optionally including a bridge, a circuit and/or other device, configured to connect multiple contact elements such as pins together to enable high current flow via them.

In various additional or supplementary embodiments, the connector comprises a preferably electrically insulating (including e.g. plastic, ceramic, any combination of such, or alike material) body member accommodating said number of electrically conductive contact elements such as pins. The body member may be configured to contact said first or second side of the substrate film. The body member may be configured to extend through the film. Yet, it may be dimensioned so as to essentially accommodate a hole in the substrate through which it extends without substantial slack.

In various additional or supplementary embodiments, the integral connector element is substantially rigid in contrast to e.g. typical flappy and flexible plastic film, optionally provided with a number of bent elements such as one or more contact elements of said number of contact elements. The bent elements may be configured to add to mechanical securing of the connector to the substrate and multilayer structure in general, while it may further enhance the related electrical coupling.

In various additional or supplementary embodiments, a plastic layer of said at least one plastic layer is located on one side (first or second) of the substrate film, and a portion of the connector to contact the external connecting element is located on the opposite side of the film. However, in some other embodiments, there may be alternative or additional plastic layer on the side of the substrate film that contains a portion of the connector that is configured to mate with the external connecting element.

In various additional or supplementary embodiments, a number of preferably elastic, mechanical locking members, optionally defining or comprising barbed protrusions and/or bosses, preferably defined by the molded at least one plastic layer, are provided and configured to contact the external connecting element when mated and facilitate securing the external connecting element to the integral connector.

In various additional or supplementary embodiments, a portion of the connector, such as a portion thereof facing and optionally contacting the external connector when mated therewith, is established by said at least one molded plastic layer.

In various additional or supplementary embodiments, the connector comprises a number of protrusions, such as barbed protrusions, entering into the said at least one plastic layer.

In various additional or supplementary embodiments, there are electrically conductive areas of the circuit design on one or advantageously both of said first and second sides of the substrate, said connector preferably directly electrically connecting to the areas on one or advantageously both sides via said number of contact members, optionally a single contact member directly mechanically and electrically connecting to the areas on said both sides. To at least partially implement the required mechanical and/or electrical connections, use of adhesive, optionally conductive adhesive, is one feasible option.

In various additional or supplementary embodiments, said substrate film defines at least one ready-made, optionally drilled, punched, pierced, pressed, molded or cut, through-hole via which the connector extends to said first and second sides.

In various additional or supplementary embodiments, said substrate film defines at least one through-hole via which a portion of the connector has been configured to extend from said first or second side to the opposite second or first side, respectively. The through-hole may have been established by the connector itself during installation thereof with reference to related piercing or crimping activity, for example.

In various additional or supplementary embodiments, the surface area of a portion of the connector, optionally body thereof, facing the substrate film has been dimensioned larger than the diameter of the at least-one through-hole so that the connector does not fully fit through said at least one through-hole.

In various additional or supplementary embodiments, at least one of the contact elements is configured to exert compressive force, optionally through spring force, on at least one electrically conductive area of the circuit design.

In various additional or supplementary embodiments, at least one contact element of said number of contact elements is bent, optionally substantially defining an angled or specifically L-profile, so that on first or second side of the substrate film a first portion of the contact element extends substantially perpendicular to the surface of the film to connect with the external connector while on the opposite second or first side of the substrate film a second portion of the contact element extends substantially parallel to the substrate film, contacting an electrically conductive area of said number of conductive areas of the circuit design thereon.

In various additional or supplementary embodiments, a counterpart or generally a locking element, optionally a locking frame is provided. It may be optionally removably attached to the integral connector to enhance securing of the integral connector to the substrate film and/or guide the external connecting element relative to the integral one.

In various additional or supplementary embodiments, the aforesaid counterpart or locking element comprises at least one springy member, such as a leaf spring, of electrically conductive material, contacting both at least one contact element of the integral connector and at least one conductive area of the substrate film to enhance electrical coupling between the two.

In various additional or supplementary embodiments, the counterpart/locking element defines a surface area facing the substrate film, greater than an area defined by one or more through-holes of the substrate film through which the integral connector extends.

In various additional or supplementary embodiments, a mechanical sealing member, optionally a gasket, has been provided on an area of the substrate film configured to receive the external connector preferably to provide a hermetic seal between the substrate film and said external connector placed thereon.

In various additional or supplementary embodiments, the substrate film defines a recess accommodating a portion of the connector, such as portion of the body member and/or contact elements thereof, and having a through-hole preferably at a bottom thereof via which the connector extends through the substrate film.

In various additional or supplementary embodiments, the connector comprises, optionally in its a body member, an angled, slanted or curved surface, the connector being configured relative to the substrate so that said angled, slanted or curved surface substantially follows the adjacent surface of the substrate, e.g. contour thereof.

In various additional or supplementary embodiments, the connector has been configured to pierce, punch or otherwise penetrate through the substrate film, preferably defining a crimp connection to the substrate and particularly to one or more of the conductive areas of the circuit design provided thereon. The crimp connection may include e.g. spring connection.

In various additional or supplementary embodiments, the connector comprises at least two portions or (sub-)connectors provided on the opposite sides of the substrate film and connected together at least functionally through the substrate film, i.e. actually physically through the film e.g. via a hole therein and/or around the edge of the film as discussed hereinelsewhere in more detail.

In various additional or supplementary embodiments, at least one of such two opposing portions comprises a number of protrusions provided through the substrate film, optionally further through electrically conductive areas of the circuit design thereon or adjacent to the areas, and connecting to the other portion.

In various additional or supplementary embodiments, said at least two portions have been connected by a number of preferably welded intermediate features established between them, optionally at least partially from the material of any of said portions.

In various additional or supplementary embodiments, the connector comprises at least one bridge portion extending over the edge of the substrate and connecting said at least two opposing portions, optionally being of monolithic construction with said at least two opposing portions.

In various additional or supplementary embodiments, the connector defines a projection extending sideways from the substrate for coupling with the external connecting element.

In various additional or supplementary embodiments, the substrate film is essentially planar or exhibits at least locally an essentially three-dimensional shape, optionally curved, angled, slanted or dome shape.

In various additional or supplementary embodiments, the circuit design further comprises or at least electrically connects to a number of components, such as electronic or optoelectronic components or devices, preferably at least partially embedded within the molded at least one plastic layer.

In various additional or supplementary embodiments, the connector further comprises a number of electronic and/or connecting components, optionally at least one integrated circuit.

In various additional or supplementary embodiments, the integral connector, optionally a body member thereof, comprises a cavity at least partially filled with the molded plastic. This may enhance securing of the connector element to the substrate and multilayer structure in general.

In various additional or supplementary embodiments, the substrate film(s) may comprise or consist of material(s) such as plastics, e.g. thermoplastic polymer, and/or organic or biomaterials with reference to e.g. wood, leather or fabric, or a combination of any of these materials with each other or with plastics or polymers or metals. The substrate film may comprise or consist of thermoplastic material. The film may be essentially flexible or bendable. In some embodiments, the film may alternatively be substantially rigid. The thickness of the film may vary depending on the embodiment; it may only be of few tens or hundreds of a millimeter, or considerably thicker, in the magnitude of one or few millimeter(s), for example.

The substrate film may, for example, comprise at least one material selected from the group consisting of: polymer, thermoplastic material, electrically insulating material, PMMA (Polymethyl methacrylate), Poly Carbonate (PC), copolyester, copolyester resin, polyimide, a copolymer of Methyl Methacrylate and Styrene (MS resin), glass, Polyethylene Terephthalate (PET), carbon fiber, organic material, biomaterial, leather, wood, textile, fabric, metal, organic natural material, solid wood, veneer, plywood, bark, tree bark, birch bark, cork, natural leather, natural textile or fabric material, naturally grown material, cotton, wool, linen, silk, and any combination of the above.

In a further, either supplementary or alternative, embodiment one or more of the included films may at least partially be optically substantially opaque or at least translucent having regard to predefined wavelengths e.g. in visible spectrum. The film may have been provided with visually distinguishable, decorative/aesthetic and/or informative, features such as graphical pattern and/or color thereon or therein. The features may have been provided on the same side of the film with the electronics so that they have been also at least partially sealed by the plastic material(s) through the associated overmolding procedure. Accordingly, IML (in-mold labeling)/IMD (in-mold decoration) technique is applicable. The film(s) may be at least partially, i.e. at least in places, optically substantially transparent to radiation such as visible light emitted by the electronics thereon. The transmittance may be about 80%, 85%, 90%, 95% or higher, for example.

The plastic layer(s) molded onto the substrate film(s) may comprise materials such as polymer, organic, biomaterial, composite as well as any combination thereof. The molded material may comprise thermoplastic and/or thermosetting material(s). Thickness of the molded layer(s) may vary depending on the embodiment. It may be, for example, in the order of magnitude of one, few or tens of millimeters. The molded material may be e.g. electrically insulating.

In more detail, the at least one molded plastic layer may comprise at least one material selected from the group consisting of: elastomeric resin, thermoset material, thermoplastic material, PC, PMMA, ABS, PET, copolyester, copolyester resin, nylon (PA, polyamide), PP (polypropylene), TPU (thermoplastic polyurethane), polystyrene (GPPS), TPSiV (thermoplastic silicone vulcanizate), and MS resin.

In some embodiments, the (thermo)plastic material used to establish the molded layer comprises optically substantially opaque, transparent or translucent material enabling e.g. visible light to pass through it with negligible loss. The sufficient transmittance at desired wavelengths may be about 80%, 85%, 90% or 95% or higher, for example. Possible further molded (thermo)plastic material may be substantially opaque or translucent. In some embodiments, the further material may be transparent.

In various additional or supplementary embodiments, the electrically conductive areas comprise at least one material selected from the group consisting of: conductive ink, conductive nanoparticle ink, copper, steel, iron, tin, aluminium, silver, gold, platinum, conductive adhesive, carbon fibre, alloy, silver alloy, zinc, brass, titanium, solder, and any component thereof. The used conductive materials may be optically opaque, translucent and/or transparent at desired wavelengths, such as visible light, so as to mask or let the radiation such as visible light to be reflected therefrom, absorbed therein or let through, for instance.

In various additional or supplementary embodiments, the contact elements of the connector comprise at least one material selected from the group consisting of: copper, silver, gold, platinum, conductive adhesive, carbon fibre, zinc, brass, alloy, and silver alloy. Again, materials may be optionally selected so as to exhibit e.g. desired optical property such as transparency, translucency or opaqueness in addition to desired electrical conductivity.

In various additional or supplementary embodiments, the connector comprises at least one feature selected from the group consisting of: pin header, crimped connector, springy contact member, spring-loaded contact member, spring-loaded contact pin or slip, contact pad, contact area, contact pin, hole preferably with walls and/or bottom of conductive material, socket, female socket, male plug or socket, hybrid socket, pin socket, and spring pin socket.

Yet, a system comprising an embodiment of the multilayer structure and an embodiment of the external element compatible for mating with the connector element of the structure may be provided.

According to one other embodiment of the present invention, a method for manufacturing a multilayer structure, comprises obtaining a (first) substrate film, such as a flexible plastic film, for accommodating electronics, said substrate film having opposing first and second sides and respective surfaces, providing, preferably at least in part by printed electronics technology, a circuit design comprising a number of electrically conductive areas of electrically conductive material on first and/or second side of the substrate film, arranging an electrical connector, said electrical connector comprising a number of electrically conductive contact elements, to the substrate film, optionally at least functionally and preferably physically through the substrate film, so that it extends to both said first and second sides of said substrate film and said number of electrically conductive contact elements connect to the conductive areas of the circuit design while being further configured to electrically couple to an external connecting element responsive to mating the external connecting element with the connector on said first or second side of or adjacent to the substrate film, and molding, optionally utilizing injection molding, thermoplastic material on said first and/or second side of the substrate film and said connector element so as to at least partially embed the electrical connector in the material, optionally fully embed a portion of connector that resides on that side of the substrate that faces away from the external connecting element when mated, thereby enhancing securing of the connector to the substrate film.

The method may further comprise providing additional material(s) or layer(s) (e.g. film(s) and/or molded layer(s)) and/or element(s) to the multilayer structure e.g. in connection with the above method items or afterwards. One or more additional (substrate) films or material layers may be provided as pre-prepared elements to the structure through lamination onto an existing layer using e.g. adhesive, heat and/or pressure, or establishing them directly from source material into the structure by molding, printing or deposition process, for example.

Thereby, e.g. a second (substrate) film may be optionally provided on the other side of the molded plastic. The second film may be located in a mold together with the first substrate film so that a stacked structure is obtained by injecting the plastic material in between, or the second film may be provided afterwards using a suitable lamination technique if not being directly manufactured on the molded plastic layer. The second film may also be provided with features such as graphics, other optical features and/or electronics on any side thereof (e.g. facing the molded plastic layer). Yet, it may have a protective purpose and/or other technical characteristics such as desired optical transmittance, appearance (e.g. color) or tactile feel. The second film may be operatively such as electrically connected to the first film, optionally by the integral connector and/or other connecting features such as one or more vias filled with conductive material or provided with conductor elements.

In various embodiments, feasible molding methods for producing material layers and related features include e.g. injection molding in connection with e.g. thermoplastic materials and reactive molding such as reaction injection molding especially in connection with thermosets. In case of several plastic materials, they may be molded using a two-shot or generally multi-shot molding method. A molding machine with multiple molding units may be utilized.

Alternatively, multiple machines or a single re-configurable machine could be used for sequentially providing several materials.

Having regard to applicable molding process parameters, e.g. the aforementioned injection molding and reactive molding are generally trustworthy options depending on the used materials, desired material properties, molding equipment, etc. To cause minimum stress to the underlying features such as electronics, low-pressure (e.g. less than about 10 bar) molding may be used in selected molding operations, such as overmolding of the second side of the first substrate as well as circuitry thereon. Different molding techniques may be applied to yield different material properties to the structure in terms of e.g. desired mechanical properties such as strength.

In various embodiments, one or more substrate films may be formed, optionally thermoformed or cold formed, to at least locally exhibit a desired, often essentially three-dimensional, target shape preferably following the provision of conductors and optional further electronics such as electronic components thereon but prior to molding the plastic layer. Forming may be utilized to define e.g. a recess in the film, which may be used to accommodate at least portion of a feature such as connector. The used materials, dimensions, positioning and other configuration of the elements such as electronics already residing on the film prior to forming and/or molding shall be selected so as to withstand the forces induced thereto by forming/molding without breakage.

In various embodiments where a substrate film is to be provided with at least one hole such as a through-hole. The hole may be provided by molding (or generally directly establishing the substrate film as provided with the hole), drilling, carving, sawing, etching, piercing (e.g. in connection with crimping), cutting (e.g. with laser or mechanical blade) or using any other feasible method as being understood by a person skilled in the art.

Yet, the at least one hole may have a desired shape, i.e. a substantially circular or angular shape, e.g. a rectangular shape. Preferably the hole is shaped and dimensioned so as to match the shapes/dimensions of the connector element in a selected fashion and to desired extent. For example, the hole may enable a number of contact elements of the connector element to pass through while remaining small enough to enable the body of the connector element to fully cover the hole and thereby seal it, for example.

In some embodiments, at least one of the holes of the at least one hole may be initially formed as a blind hole in the substrate by thinning, for example. In that case, upon providing the connector element to the substrate, protrusion type contact elements thereof, such as pins, may be configured to pierce or punch through the bottom of the blind hole to enter the other side of the concerned film. In some supplementary or alternative embodiments, however, contact element(s) such pins(s) of the connector element may be configured to pierce or punch through the substrate at location(s) not provided with blind hole(s) or other particularly processed-for-piercing region(s) upfront, which is convenient from the standpoint of reducing the number of required manufacturing steps or operations. Accordingly, the element(s) to be provided through the film can be themselves utilized for producing the necessary hole therein upon installation.

In various embodiments, in addition to providing a portion of the connector through a substrate film, a number of further holes or vias may be established in the film(s) and/or other layer(s) such as molded layer(s) of the multilayer structure for e.g. electrically and/or optically connecting the opposing first and second sides thereof together, in practice referring to e.g. electronics on both sides of the concerned film/layer together. Generally, such vias or basically through-holes may be correspondingly provided by molding (or generally, directly establishing the substrate film with the hole), drilling, chemically (through etching, for example), carving, sawing, etching, cutting e.g. with laser or mechanical blade, or using any other feasible method as being understood by a person skilled in the art. The vias may have a desired cross-sectional shape, i.e. a substantially circular or angular shape, e.g. a rectangular shape, or elongated (slit) shape.

The aforementioned vias may be provided with selected material(s) such as electrically conductive and/or optically transmissive materials using a selected filling method such as molding, mounting or printing. The materials may include adhesives, epoxies, metals, conductive ink, fluidic material such as gaseous or liquid matter, etc. The material may be formable so that it withstands e.g. bending strain. In some embodiments, the via(s) may remain open (unfilled) so as to enable e.g. internal sensor such as atmospheric sensor to operably couple to the environment therethrough.

In various embodiments, one or more features, such as electronic components or other elements, may be provided to a target substrate such as a film or molded layer of the multilayer structure by (additive) printed electronics technology, subtractive manufacturing techniques and/or mounting with reference to e.g. SMD/SMT (surface-mount device/ surface-mount technology), for example. One or more of the features may be provided on substrate areas that are at least partially covered by the molded plastic so that the features themselves are also at least partially covered by it.

The mutual execution order of various method items may vary and be determined case-specifically in each particular embodiment. For example, the second side of the first substrate film may be overmolded prior to the first side, after the first side or substantially simultaneously; for instance, molded material may be injected so that it propagates from the initial side to the opposite side of the film e.g. via an existing or pressure-induced through-hole therein.

The previously presented considerations concerning the various embodiments of the multilayer structure may be flexibly applied to the embodiments of the related manufacturing method mutatis mutandis, and vice versa, as being appreciated by a skilled person. Yet, various embodiments and related features may be flexibly combined by a person skilled in the art to come up with preferred combinations of features generally disclosed herein.

The utility of the present invention arises from a plurality of issues depending on the embodiment.

An electrical connector structure or connector element, or simply a connector, for providing electrical, e.g. power and/or communications, connection to an external device, system or structure may be conveniently, reliably, and with good visual quality integrated, secured and embedded within a functional, circuit design and various electronics-containing multilayer structure generally manufactured in accordance with IMSE principles, for instance.

In some embodiments, conductive region(s) may be first provided on a substrate, either on one or both sides/surfaces thereof, e.g. by printed electronics technology. Subsequently, the connector may be then provided to the substrate such that it extends to both sides of the substrate, optionally by providing it partially through a number of pre-prepared holes in the film or by creating the holes on the fly through crimping the connector and/or piercing the film by the (contact elements of the) connector, for instance. Additionally or alternatively, connection around the edge of the substrate may be exploited for connecting or generally providing mutually connected connector portions on both sides of the substrate. Nevertheless, the connector can be said to be provided at least functionally through the substrate film.

Accordingly, the electrical contact elements of the connector preferably physically and electrically connect to the region(s) on one or both sides of the substrate as intended. The molded plastic layer may be further utilized to secure the connector to the substrate in addition to protecting it.

Depending on the embodiment, both custom-made connectors and commonly available connectors may be utilized in conjunction with the present invention. The connector may comprise e.g. multiple pins as contact elements to make a connection to the printed wiring pads or other conductive regions of the circuit design provided on the film. The spring force of the contact elements such as pins of the conductor element may be configured so as target the conductive contact areas on the substrate film to enhance or secure physical and thus also electrical contact therebetween. In some embodiments, bendable contact elements such as pins may be applied (bent) so as to enhance the contact with the conductive areas on the substrate e.g. by the associated spring force. The force subjected by the contact elements to the conductive areas on the substrate may include a compressive force as being appreciated by a person skilled in the art.

Generally, the connector element shall preferably comprise electrically conductive material such as preferred metal (silver, copper, gold, etc.) or e.g. conductive polymer, which is used to establish electrical connection to the circuit design on one or more substrates, or generally layers, of the multilayer structure, internal connection(s) of the connector element and connection to the compatible counterparts of an external connecting element such as connector of an external device or of a connecting cable therefor. In various embodiments, the same contact elements provided in the connector element may be configured to implement electrical coupling both with the circuit design of the multilayer structure and the external connector/device. For example, a number of elongated contact elements may be coupled from one end or nearer to one end to the circuit design of the multilayer structure and from the other end to the external connecting element, while being at least partially enclosed e.g. from a center portion within a connector body of e.g. plastic, ceramic, rubbery or other material, which may be electrically insulating. Complex and space-consuming connectors with own dedicated housing essentially outside the multilayer structure may be omitted. The location of the connector element(s) may be flexibly determined and there's no absolute need to position the connectors e.g. at the lateral edges of a multilayer structure anymore, which greatly adds to the structural and potentially also functional versatility of the structure and host devices or products they may be disposed at.

The connector shall preferably further comprise, e.g. in its body and/or electrical conductors such as contact elements, structurally sufficiently durable material(s) such as metal, plastic, or ceramic material, thus tolerating repeated installation and removal of an external element such as external connector relative thereto.

Yet, the connector element may be supplemented with a number of locking members such as (barbed) protrusions, bosses and/or boss-base combinations in the multilayer structure. For instance, one or more hole(s) or other areas may be defined in the substrate film through which the molded plastic flows during molding and defines the members. One potential function of the locking members may be in retaining the external element such as an external connector in correct position, e.g. mated with the integral connector, and preventing it from getting loose unintentionally, for example.

Still, a number of counterpart or generally securing elements, e.g. locking frames, may be provided to secure (e.g. for molding and/or generally) and/or align the connector to the substrate. For example, if the connector is provided from one side of the substrate film to the opposing side of the substrate film so that it goes partially through the substrate film e.g. via a hole therein, the counterpart element may be provided on the opposing side into contact with the protruding portion of the connector and optionally with the substrate itself. Such securing element or frame may provide support for spring force subjected by the contact elements such as pins of the connector to the conductive (contact) areas on the substrate in favor of securing the associated physical/electrical connection therebetween. The frame may alternatively or additionally be utilized as a sealing member during injection molding. It may include mold flow cavities or holes for receiving the molded plastics. In some embodiments, the frame may be configured to establish a securing and/or guiding feature for the mated external connector.

In various embodiments, the connector or component/portion thereof (e.g. body) may be of sealed type, e.g. waterproof or dustproof or otherwise environmentally sealed type, and thus generally offer a desired level of protection (e.g. desired IP rating, International Protection/Ingress Protection) having regard to selected solids, fluids, gases, liquids, etc.

Further features such as molded features, screws or rivets may be applied in securing the suggested multilayer structure to an external structure and/or host device. The multilayer structure may define e.g. a hole, or more specifically a threaded hole dimensioned for a selected threaded fixing element such as a screw.

The suggested manufacturing method applying overmolding is relatively straightforward and what is considered beneficial, does not necessitate adopting completely new or different manufacturing technologies just for producing the sufficient connectivity in the context of printed and in-mold electronics. By forming the film(s) to a desired 3D shape e.g. after provision of conductors and optionally further electronics thereon while the substrate film was still substantially planar, may reduce or obviate a need for potentially tedious and error prone 3D assembly of electronics on a substrate.

A similar connector could also find use in other scenarios wherein the electrical connection is potentially unnecessary, but e.g. optical and/or thermal connection is desired. Instead or in addition to conductive material, electrical wiring or e.g. printed traces, the connector may comprise e.g. optical fiber.

The obtained multilayer structure may be used to establish a desired device or module in different host elements such as vehicles or specifically (in-)vehicle electronics, lighting devices including vehicle lighting, user interfaces in vehicles and elsewhere, dashboard electronics, in-vehicle entertainment devices and systems, vehicle interior or exterior panels, intelligent garment (e.g. shirt, jacket, or trousers, or e.g. a compression garment), other piece of wearable electronics (e.g. wristop device, headwear, or footwear), personal communications devices (e.g. smartphone, phablet or tablet) and other electronics. The integration level of the obtained structure may be high and desired dimensions such as the thickness thereof small.

The used film(s) may contain graphics and other visually and/or tactilely detectable features thereon, whereupon the film may have aesthetic and/or informative effect in addition to hosting and protecting the electronics. The film(s) may be translucent or opaque at least in places. They may exhibit a desired color or comprise portions exhibiting a desired color to the corresponding portions of the structure. The obtained multilayer structure may thus incorporate one or more color/colored layers that optionally determine graphics such as text, pictures, symbols, patterns, etc. These layers may be implemented by dedicated films of certain color(s), for instance, or provided as coatings (e.g. through printing) on existing film(s), molded layer(s), and/or other surfaces. Exterior film(s) of the multilayer structure may be configured to establish at least a portion of outer and/or inner surface of the associated host product or host structure.

The visual features such as patterns or coloring may be provided via internal layers, e.g. on the side of a (substrate) film that is facing the molded plastics so that the features remain isolated and thus protected from environmental effects at least by the thickness of the film and optionally of the molded layer depending on which side the film was provided relative to the environmental threat. Accordingly, different impacts, rubbing, chemicals, etc. that could easily damage e.g. painted, printed or mounted surface features do not affect or reach the features. The film may be easily manufactured or processed, optionally cut, into a desired shape with necessary characteristics such as holes or notches for exposing the underlying features such as the molded material.

The molded plastic material(s) may be optimized for various purposes including securing the connector and/or various electronics. Yet, the material(s) may be configured to protect the connector, electronics and/or other features included in the multilayer structure from e.g. environmental conditions such as moisture, heat, cold, dirt, shocks, etc. It may further have desired properties in view of light transmittance and/or elasticity, for example. In case the embedded electronics includes light- or other radiation-emitting or receiving components, the material(s) may have sufficient transmittance to enable light/radiation transmission therethrough at least selectively (e.g. certain wavelengths).

The expression "a number of" may herein refer to any positive integer starting from one (1).

The expression "a plurality of" may refer to any positive integer starting from two (2), respectively.

The terms "first" and "second" are herein used to distinguish one element from other element, and not to specially prioritize or order them, if not otherwise explicitly stated.

When "different" or "various" embodiments of the multilayer structure, related method of manufacture, or features included therein are referred to herein, the embodiments are to be considered mutually supplementary and may thus be realized in common embodiments, unless being otherwise explicitly stated or otherwise clear to a person skilled in the art that the concerned solutions are mutually clearly exclusive alternative solutions for implementing the very same feature of the solution.

Different embodiments of the present invention are disclosed in the attached dependent claims.

BRIEF DESCRIPTION OF THE DRAWINGS

Next the present invention will be described in greater detail with reference to the accompanying drawings, in which.

DETAILED DESCRIPTION

Figure 1:
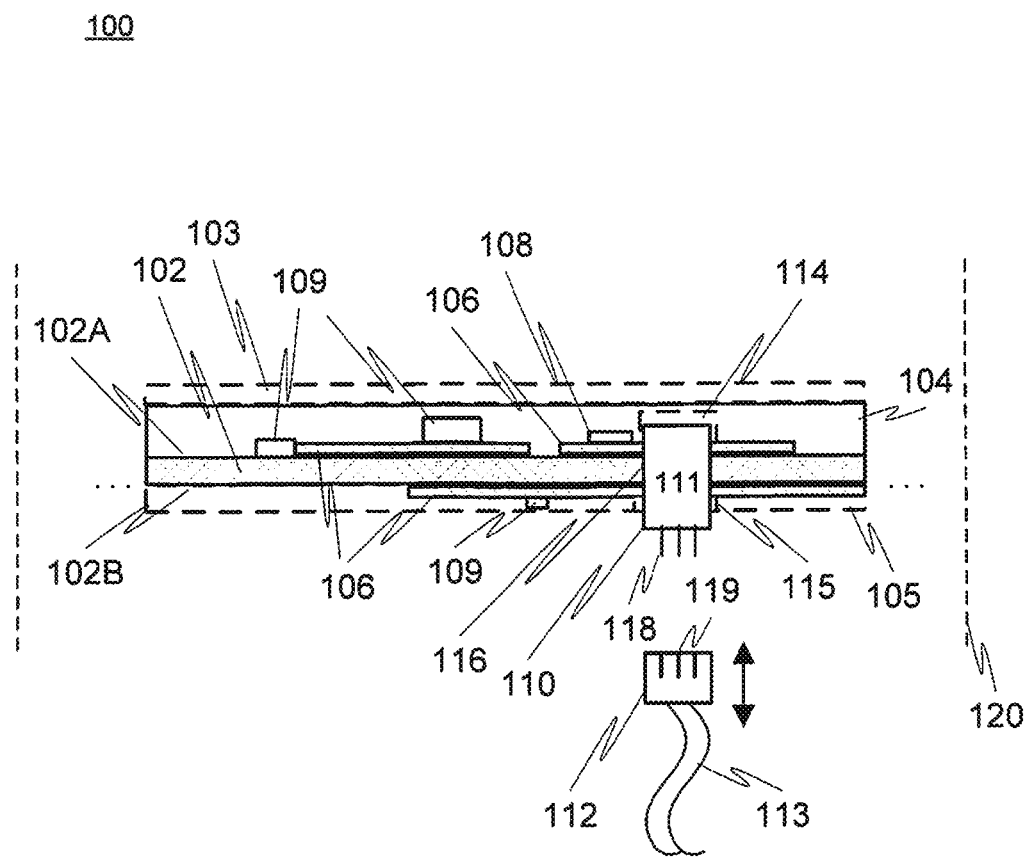
FIG. 1 illustrates, via a side view, a general embodiment of a multilayer structure in accordance with the present invention, incorporating an integral connector element.

FIG. 1 illustrates, via a (cross-sectional) side view, an embodiment 100 of a multilayer structure in accordance with the present invention.

The multilayer structure 100 may establish an end product per se, e.g. an electronic device, or be disposed in or at least connected to a host device, host system or host structure 120 as an aggregate part or module, for example. It 100 may comprise a number of other elements or layers not explicitly shown in the figure for clarity reasons.

The structure 100 contains at least one, so-called first, substrate film 102 with two opposing sides 102A, 102B as already discussed hereinbefore.

Item 104 refers to a plastic layer molded upon the film 102. In some embodiments, there may be at least one other, supplementary or alternative, molded plastic layer or otherwise established layer 105 in the structure 100, e.g. on the other, opposing side 102B of the film 102 as shown in the figure. It 105 may have a protective, securing and/or aesthetic purpose, for instance. Generally, electrically conductive or non-conductive adhesive(s) may be utilized in various embodiments of the present invention to secure features such as the connector to the substrate and specifically e.g. to the circuit design thereon.

In some embodiments, at least portion of the other plastic layer 105 may result from plastic material of the first layer 104 penetrating and flowing into the opposing side of the film 104 during molding, e.g. via a thinned portion or pre-prepared hole therein. Accordingly, the layer 105 may establish desired (functional) forms and features such as securing or protective features on the film 102.

On the other side of the molded plastic layer 104, a further (substrate) film 103 may have been provided. This optional film 103 of same or different material with the first film 102 may accommodate e.g. electronics, graphics and/or other features considered advantageous.

Nevertheless, the first film 102 preferably accommodates a circuit design on either or both sides 102A, 102B and respective surfaces thereof, comprising a number of electrically conductive areas 106, such as contact pads and wiring/electrical conductors, preferably additively produced thereon by means of printed electronics technology such as screen printing, tampo printing, flexography or ink jetting.

A number of additional elements such as electronic components and/or other functional/decorative elements 109, such as optical elements (lightguide, reflector, mask, graphical element, etc.) and/or thermal (e.g. insulating or conducting) elements, may have been further provided in the structure 100, e.g. upon the film 102 optionally forming part of the overall circuit design. A number of e.g. electrically conductive vias may be arranged through the substrate film(s) 102, 103 and/or other layers, e.g. molded layer(s) 104, 105, to connect e.g. circuitry or other features of different material layers together or to external elements.

Item 110 refers to a preferably electrical connector, or connector element. In some embodiments the connector 110 may contain a body member 111 of e.g. monolithic or composite construction. The connector 110 such as the body member 11 thereof may comprise e.g. electrically substantially insulating material such as selected plastics (e.g. polycarbonate, polyimide) or ceramic material as contemplated hereinbefore. In terms of providing electrical connectivity, the connector 110, however, preferably comprises a number of electrically conductive contact elements 118, such as pins or other features optionally sticking out from the body 111. The contact elements 118 are utilized to electrically (galvanically) couple an external connecting element such as another connector 112, equipped e.g. with compatible contact elements 119, with the circuit design (typically selected electrically conductive areas 106 thereof) of the multilayer structure 100. The external connecting element 112 may provide electrical connection, e.g. via cabling 113, between the internals of the multilayer structure 100 and external or host device(s) associated therewith.

The connector 110 has been provided or assembled relative to the substrate film 102 so that it extends to both sides 102A, 102B of the film 102. For instance, a portion of the connector element 110 may have been directed through the substrate film 102 using pre-prepared (e.g. by drilling, cutting, etching or molding) or dynamically created (upon piercing/crimping of the connector 110, for example) hole(s) 116 advantageously so that at least one or more contact elements 118 thereof have been conveyed from the initial installation side 102A, 102B to the opposite side 102B, 102A of the substrate film 102 to enable electrical coupling through the substrate film 102.

The circuit design may further comprise a number of (internal) connecting components 108, optionally including a bridge, a circuit and/or other device, configured to connect e.g. multiple contact elements 118, e.g. as pins, at least operatively such as electrically together to enable high current flow via them. The connecting component 108 may be (directly) coupled to the conductive area(s) 106 and e.g. positioned on or adjacent to them, for instance.

In various embodiments there may be one or multiple holes arranged in the substrate film 102, For example, the end of each contact element 118 extending from the body 111 of the connector 110 may be associated with a dedicated or shared hole to pass through the film 102.

The body 111 of the connector 110 element, however, may be located on either side 102A, 102B side of the film 102 substantially completely. In other embodiments (e.g. the one sketched in FIG. 1), also the body 111 itself may have been partially arranged through the film 102.

One or more locking elements of e.g. counterpart and/or locking frame type 114, 115 may have been provided on either or both sides 102A, 102B of the substrate 102 for additionally securing the connector 110.

Based on the foregoing, the connector 110 may thus have been secured to the substrate film 102 using a variety of means with reference to configuration and dimensioning of its integral features such as body 111 and contact elements 118, and use of additional securing features such as plastic 104, 105 molded thereon, locking elements 114, 115, and/or e.g. non-conductive adhesive, conductive adhesive, paste, etc.

For example, the body 111 and/or contact elements 118 may have been dimensioned and/or shaped, either initially or subsequent to arranging e.g. a portion of the connector 110 through the film 102, such that there is no excessive or substantial slack between the connector 110 and the edges of the hole 116 and/or such that the connector 110 cannot be provided at least completely through the film 102 in either or both directions, not at least without enlarging the hole 116 and potential other surrounding features. In some embodiments, the molded plastics 104, 105 may be used to seal the hole 116. In some embodiments, the connector 110 or specifically the body 111 thereof may include a flange or generally a bulging portion that prevents it from fully fitting through the hole 116.

In various embodiments, the connector 110 or e.g. specifically the aforesaid body 111 thereof may be made substantially rigid or stiff. It may then better withstand e.g. repeated physical mounting and removal of external connectors 112 into or away from contact therewith, respectively. The mounting and removal may refer to simple push and pull type actions or require more complex activities if the procedure involves use of e.g. additional locking members as discussed hereinafter. The rigidity or generally durability of the connector 110 may be obtained by means of suitable materials and related dimensions such as material thicknesses. The connector 110 may in addition to or instead of rigid portions include elastic, flexible and/or springy portions e.g. in the contact elements 118 or body 111 thereof.

Yet, the multilayer structure 100 or specifically connector 110 thereof may contain one or more mechanical locking members (not shown in FIG. 1 for clarity reasons) for securing the external connector 112. Such member(s) may be established from the molded plastics, for example. An embodiment of one applicable locking member is described in more detail hereinafter with reference to FIGS. 5A and 5B.

In various embodiments, the molded layer(s) 104, 105 preferably embed at least a portion of the circuit design and of the connector 118.

In addition to or instead of e.g. printed versions, the elements and/or electronic components 109 may include ready-made components (surface-) mounted on the substrate 102, such as so-called surface-mounted elements. For example, adhesive may be utilized for mechanically securing the electronics on the substrate. Additional electrically conductive material(s) such as conductive adhesive and/or solder may be applied for establishing electrical and also mechanical connections between selected features such as conductive areas 106 and components 109.

The components 109 may thereby include passive components, active components, optoelectronic (or opto-electrical) components, ICs (integrated circuit), printed, such as screen printed, components and/or electronic sub-assemblies. For instance, one or more components 109 may have been first provided on a separate substrate, e.g. a circuit board such as an FPC (flexible printed circuit) or e.g. rigid, e.g. FR4 type (flame retardant), board, and subsequently attached as a whole (i.e. as a sub-assembly) to the target substrate 102.

Generally, the multilayer 100 structure may comprise or implement e.g. at least one electronic component, other functional element or other feature selected from the group consisting of: electronic component, electromechanical component, electro-optical component, radiation-emitting component, light-emitting component, LED (light-emitting diode), OLED (organic LED), side-shooting LED or other light source, top-shooting LED or other light source, bottom-shooting LED or other light source, radiation detecting component, light-detecting or light-sensitive component, photodiode, phototransistor, photovoltaic device, sensor, micromechanical component, switch, touch switch, touch panel, proximity switch, touch sensor, atmospheric sensor, temperature sensor, pressure sensor, moisture sensor, gas sensor, proximity sensor, capacitive switch, capacitive sensor, projected capacitive sensor or switch, single-electrode capacitive switch or sensor, capacitive button, multi-electrode capacitive switch or sensor, self-capacitance sensor, mutual capacitive sensor, inductive sensor, sensor electrode, micromechanical component, UI element, user input element, vibration element, sound producing element, communication element, transmitter, receiver, transceiver, antenna, infrared (IR) receiver or transmitter, wireless communication element, wireless tag, radio tag, tag reader, data processing element, data storage element, electronic sub-assembly, light directing element, lightguide, lens and reflector.

In some embodiments, subsequent to mating of the external connector 112, desired portion(s) of the resulting aggregate structure 100, 112 including e.g. the connection region may be provided with additional material to further protect and/or secure, among other potential objectives, the connection and related elements. For example, low pressure molding or resin dispensing (provision of epoxy) may be utilized for the purpose.

The film(s) 102, 103 may have been shaped according to the requirements set by each use scenario. Therefore, forming such as thermoforming may have been applied to the film 102, 103, optionally subsequent to provision of at least some features such as conductive areas, connector and/or components of the circuit design thereon, to at least locally provide e.g. a desired 3D shape such as a pocket shape in the film 102, 103.

The features described having regard to the sketch of FIG. 1 are freely and selectively applicable in connection with various embodiments of the connector elements and multilayer structures of the present invention in general, including the solutions explained in more detail hereinbelow, unless otherwise stated or being otherwise clear to a person skilled in the art with reference to e.g. clearly mutually exclusive features. Yet, various features of the embodiments described hereinbelow are similarly freely, selectively mutually combinable as being easily apprehended by the skilled person.

Figure 2:
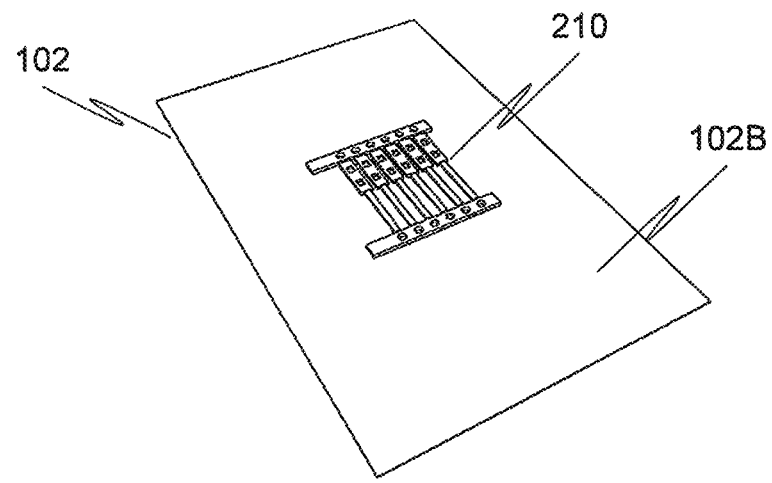
FIG. 2 depicts a substrate film of one embodiment of the multilayer structure with an embodiment of a connector initially provided thereon.

FIG. 2 depicts, at 200, a substrate film 102 of one embodiment of the multilayer structure with a connector 210 provided thereon in its initial stage. The connector 210 may have been crimped or otherwise installed to the substrate 102 so that e.g. contact elements thereof have pierced through it.

Figure 3:
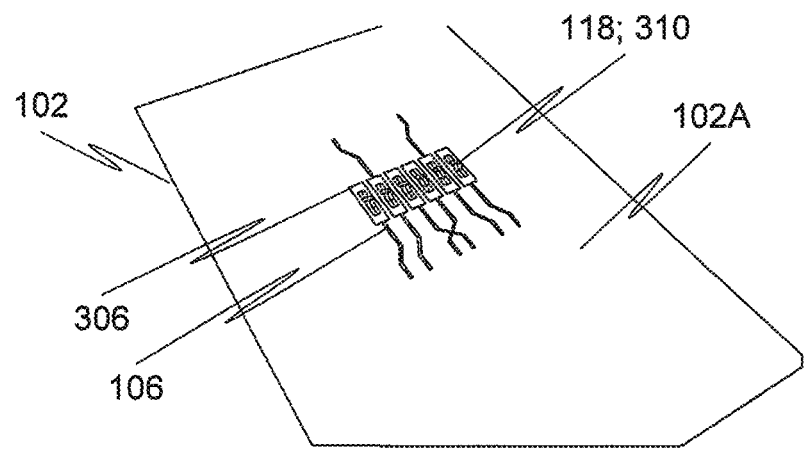
FIG. 3 depicts the embodiment of FIG. 2 from the opposite side of the substrate film.

FIG. 3 depicts, at 300, the embodiment of FIG. 2 from the opposite side 102A of the substrate film 102. The figure shows conductive areas 106 including e.g. contact areas 306 for the contact elements 118 of the connector 210 provided through the film 102. The contact elements 118 and/or other elements such as potential body 111 of the connector 210 may define overhang and/or barbed protrusions 310 upon the film 102, which especially when overmolded by a plastic layer 104, 105 enhance fastening of the connector 210 therewith.

Figure 4A:
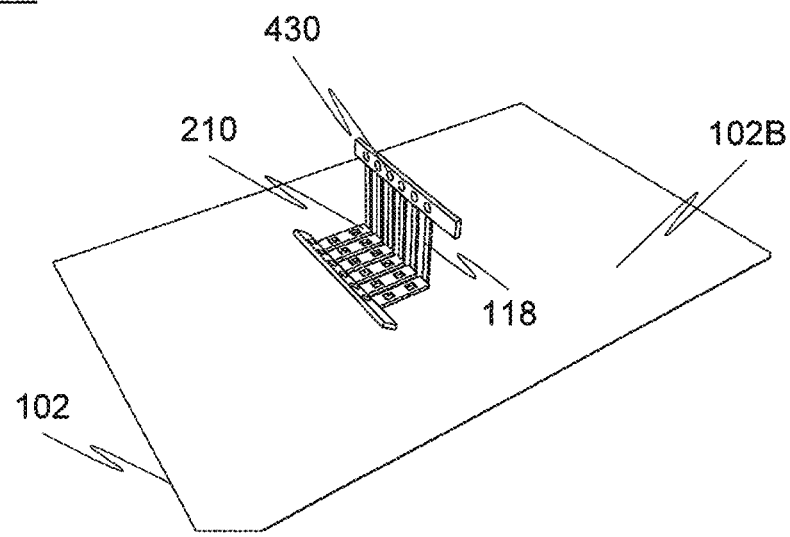
FIG. 4A illustrates the embodiment of FIGS. 2-3 with a portion of the connector bent away from the surface of the substrate.
Figure 4B:
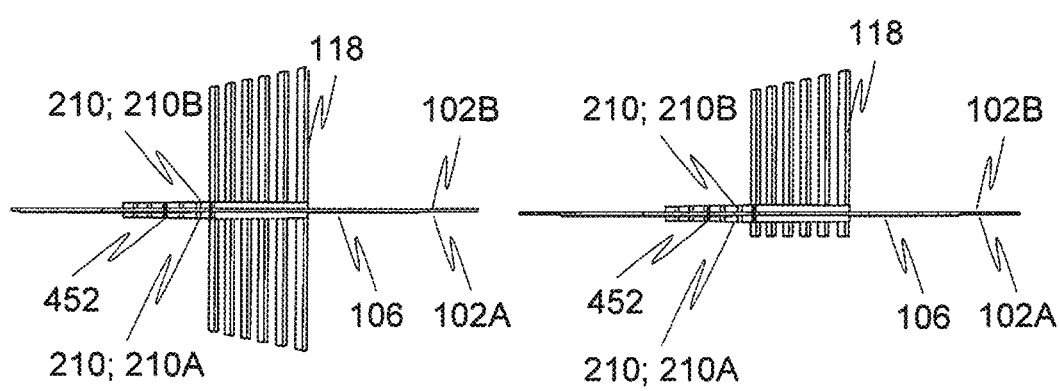
FIG. 4B illustrates two variations of the embodiment of FIGS. 2-3, wherein both, mutually opposing, sides of the substrate film have been provided with connectors or connector portions coupled together through the substrate film.
Figure 4C:
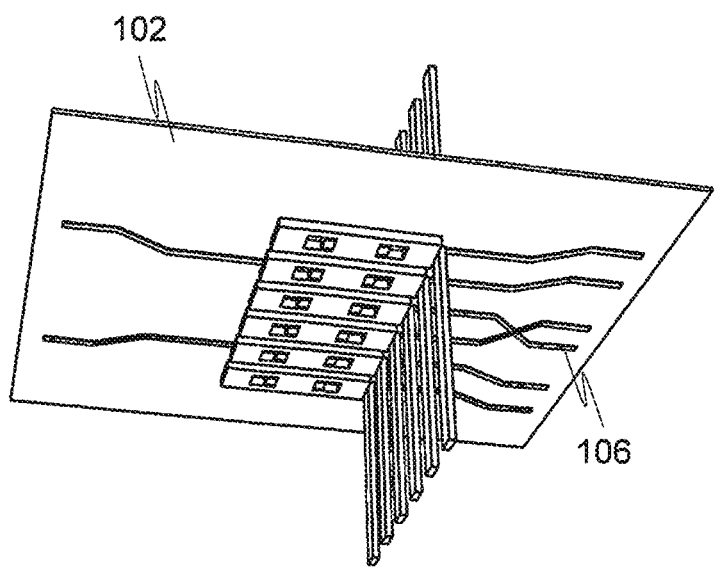
FIG. 4C further illustrates the connector having mutually connected connector portions or (sub-)connectors on both sides of the substrate.
Figure 4D:
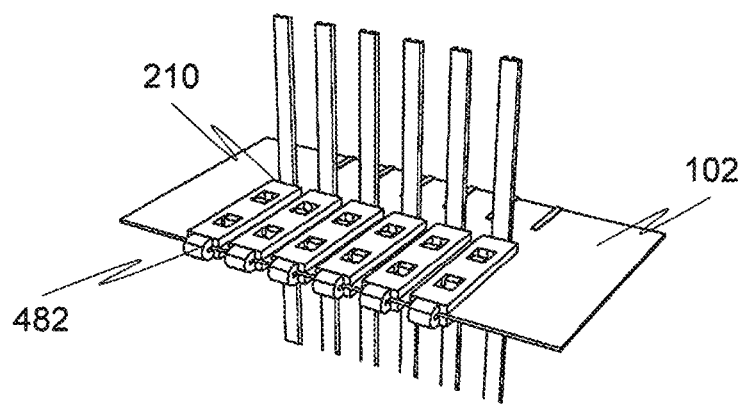
FIG. 4D illustrates one more variation of the embodiment of FIGS. 2-3, wherein connector portions or connectors on both sides of the substrate film have been mutually connected around the edge of the substrate in addition to or instead of connection directly through the substrate film.
Figure 5A:
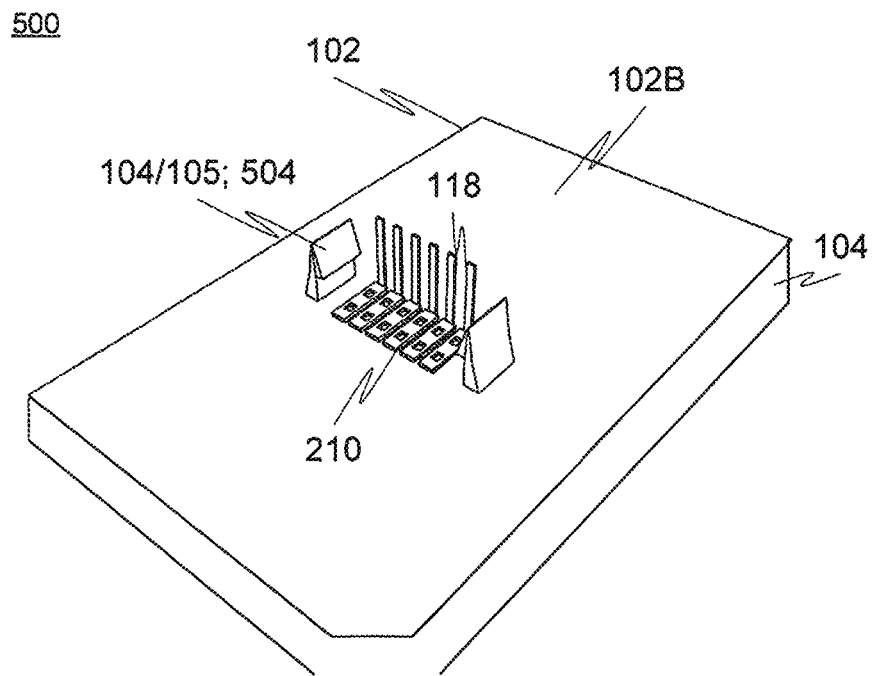
FIG. 5A illustrates the above embodiment with a plastic layer molded upon the substrate.

FIG. 4A illustrates, at 400, the embodiment of FIGS. 2 and 3 with one end of the connector element 210 bent away from the surface of the substrate film 102, while FIG. 5A generally illustrates, at 500, the embodiment of FIGS. 2-4 with at least one plastic layer 104, 105 further molded upon the substrate 102. For example, one layer of plastic material may have been molded onto one side and respective surface 102A of the substrate film 102, wherefrom it may have optionally protruded, via ready-made or dynamically forming hole(s), onto other side 102B. Alternatively, at least one plastic layer may have been directly molded upon side 102B.

In FIG. 4A, a spacing element 430 to maintain, for instance, the bent portions of the contact elements 118 of the connector 210 mutually aligned with appropriate spacing is still present, whereas in FIGS. 4B-4D and 5A-5B, such feature 430 has been removed. Alternatively or additionally, feature 430 could represent e.g. a connecting portion for connecting with an external connecting element, which connecting portion could thus remain in the connector after manufacturing.

One or more, advantageously flexible, locking members 504, potentially equipped with barbed/overhang portions, for securing the external connector 112 may have been provided upon the film 102, optionally at least partly defined by the molded plastics 104, 105.

In FIG. 4B, two 450, 460 variations of the connector 210 are shown together with the substrate 102. In such and similar embodiments, the connector 210 may at least initially be of multipart nature.

At 450, the connector 210 comprises two portions (e.g. connector parts or halves) or essentially (sub-)connectors 210A, 210B that may be located on opposing sides 102A, 102B of the substrate film 102 and connected 452 together through the film 102 by crimping, for example. A number of integral features or material of 210A, 210B or dedicated, separate connecting features may be generally configured to provide such connections.

The connector portions, or (sub-)connectors, 210A, 210B may be mutually substantially identical (as shown), similar or differ from each other more radically. In some embodiments, the portions 210A, 210B may have compatible, e.g. male and female type, connecting portions for enhanced mutual connectivity. Preferably the portions 210A, 210B are or at least contain electrically conductive material as contemplated hereinelsewhere. The portions 210A, 210B may be configured to provide a connecting capability to compatible connecting elements such as (external) connectors on both sides 102A, 102B of the substrate film 102.

Yet, conductive areas 106 of the circuit design may reside and connect to the connector 210 on either or both sides 102A, 102B of the substrate film 102 via the respective portions 210A, 210B, although the conductive areas 106 have been illustrated in the figure on side 102A only. The connector 210 may thus be in some embodiments configured to electrically couple conductive areas 106 of the circuit design on opposite sides 102A, 102B of the substrate 102 together.

At 460, a generally similar solution is illustrated but portion 210A now omits the contact elements 118 for connecting to a connecting element or at least, contains clearly different contact elements 118 than portion 210B.

Notwithstanding the approach taken, use of portions 210A, 210B may, for example, enable securing the connector 210 more easily or effectively to the substrate 102, or enable utilizing a selected installation method, such as selected crimping method, for providing the connector 210.

At 470 in FIG. 4C, a further, merely exemplary sketch of a multi-side, initially multipart connector structure following e.g. the afore-discussed principles is shown.

At 480 in FIG. 4D, alternative or additional configuration for connecting the connector portions positioned on the opposing sides 102A, 102B of the substrate film 102 is depicted. A conductive, connecting bridge structure 482 such as a number of disposed or printed electrically conductive, potentially elongated, elements extending from a side of the substrate to another and proceeding around the edge (border) of the substrate film 102 is shown. The structure 482 could be generally established from features originally integral with the portion(s) 102A, 102B by bending, for instance, and/or from separate connecting features. In some embodiments, the portions 102A, 102B, and structure 482 could even be monolithic or integral structure already when provided to the substrate 102. Accordingly, the connector 210 can be functionally provided through the substrate film 102 (i.e. from a side to another) even though the connection provided by the connecting structure 482 is not at least solely established physically directly through the substrate e.g. via a through-hole therein.

Figure 5B:
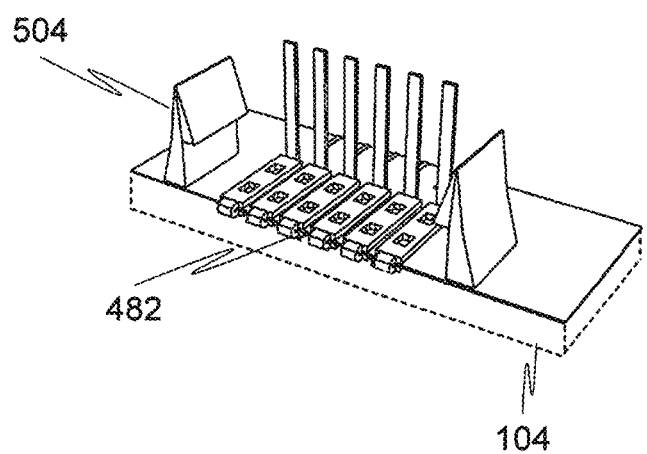
FIG. 5B depicts the connection between connectors or connector portions on opposing sides of the substrate film generally in accordance with the solution of FIG. 4D, after molding of the plastic layer.

FIG. 5B generally illustrates, at 510, the embodiment of FIG. 4D with plastic layer(s) 104, 105 molded upon the substrate film 102.

Figure 6:
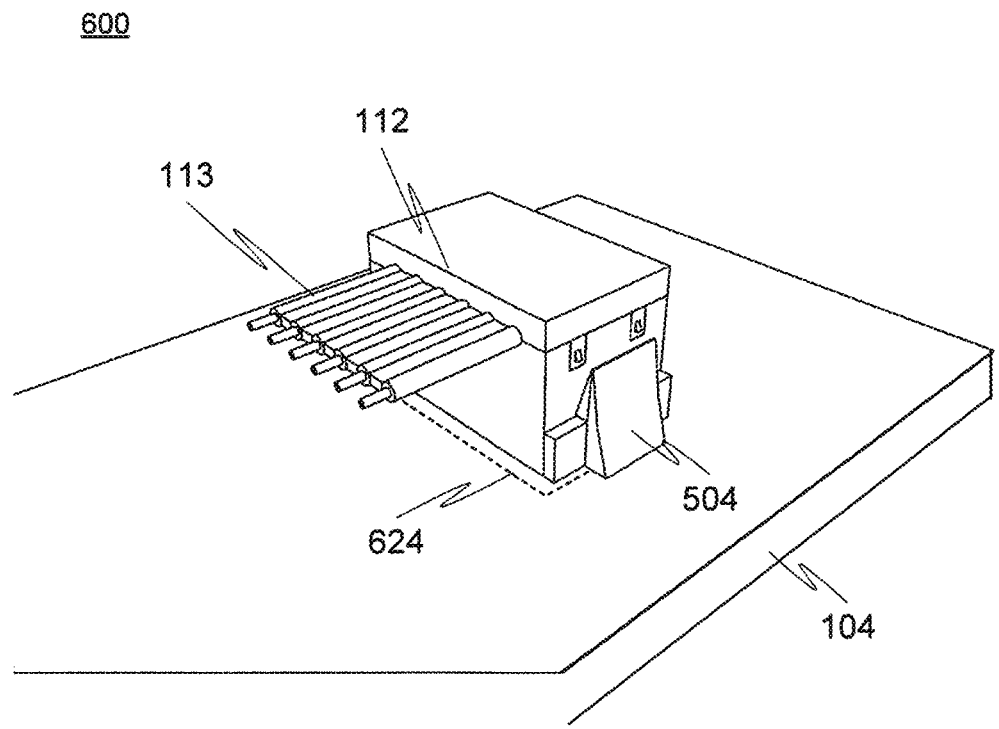
FIG. 6 illustrates the embodiment of an external connecting element mated with the integral connector of the multilayer structure.

FIG. 6 illustrates, at 600, an embodiment of an external connecting element, essentially in this example a connector, 112 mated on the integral connector 210 of the multilayer structure, preferably additionally secured by the locking members 504 (the overhang/barbed portion of which may be accommodated by a recess of the connector 112) e.g. as shown.

A sealing member 624 in the form of e.g. gasket (containing e.g. rubber or plastic, preferably elastic, material) may have been provided on the substrate 102 to face and contact the external connector 112.

Figure 7:
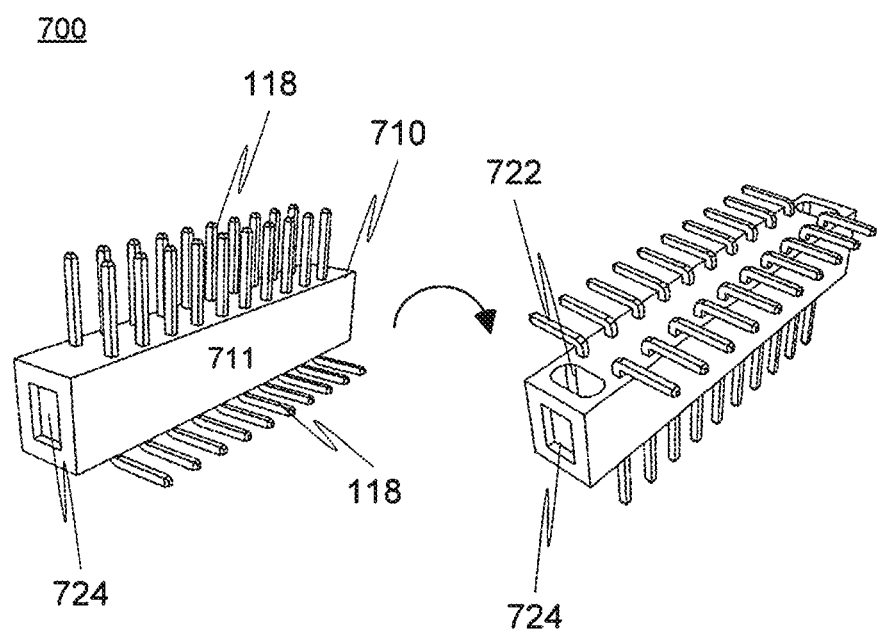
FIG. 7 illustrates one embodiment of a connector applicable in conjunction with a multilayer structure disclosed herein.

FIG. 7 illustrates, at 700, one embodiment of a connector element 710 applicable in conjunction with multilayer structures suggested herein. The connector 710, reminding of a so-called TMM connector, comprises a plurality of contact elements 118 in the form of elongated, bent (L-shape) pins protruding through the body 711 as shown. The dimensions may vary per embodiment but may be e.g. in the order of magnitude from few to few tens of millimetres depending on the measure. The body 711 may include a locking feature 724 such as a recess for accommodating a compatible protrusion of a counterpart locking element 114, 115 such as a locking frame. It 711 may additionally or alternatively include a cavity 722 for accommodating molded plastics to further enhance securing thereof.

Figure 8:
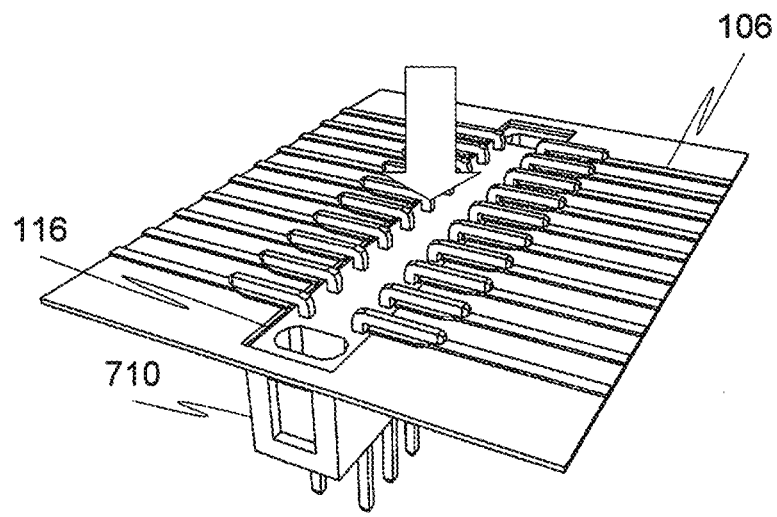
FIG. 8 illustrates the connector of FIG. 7 as partially disposed through a hole in a substrate.

FIG. 8 illustrates, at 800, the connector of FIG. 7 as partially disposed through a hole 116 in a substrate in the direction of an arrow depicted. Accordingly, the contact elements 118 have formed a physical and electrical connection with conductive areas 106 of essentially trace shape in this example on the substrate film. As the contact elements 118 are of elongated pin nature, whose end has been bent to follow the traces 106 substantially in parallel upon the film, the contact area between the two and thereby also the established electrical contact is enhanced in contrast to e.g. substantially point-type contact regions.

Figure 9:
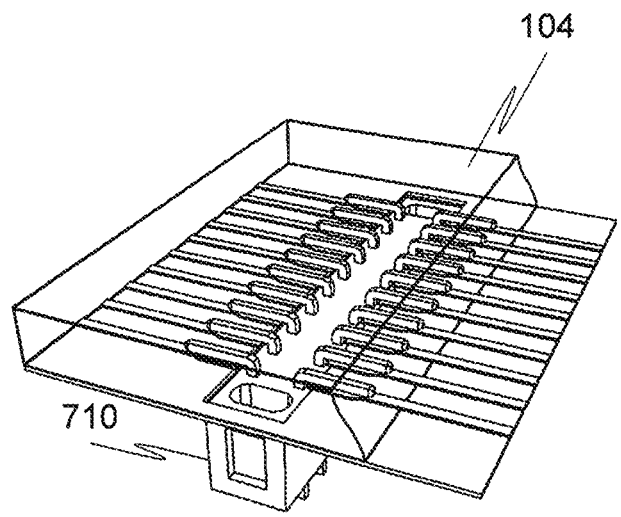
FIG. 9 illustrates the connector of FIGS. 7-8 as partially disposed through the substrate having a plastic layer molded thereon, thereby essentially forming one embodiment of a multilayer structure discussed herein.
Figure 10:
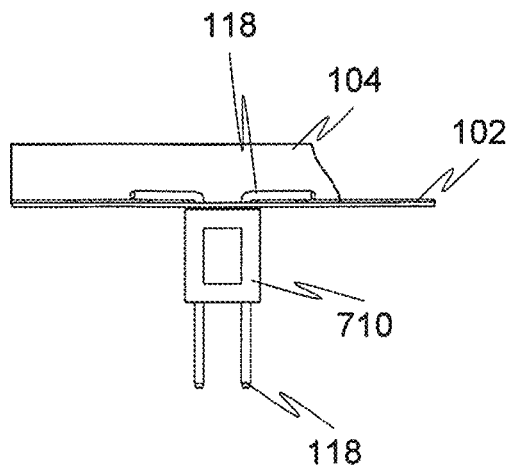
FIG. 10 is a side view regarding the scenario of FIG. 9

FIG. 9 illustrates, at 900, via a sectional cut view, the connector 710 of FIGS. 7-8 as partially disposed through the substrate having a plastic layer 104 molded thereon, thereby essentially forming one embodiment of multilayer structures discussed herein. The plastic layer 104 secures the connector element to the substrate while additionally protecting it. FIG. 10 shows, at 1000, a side view regarding the same.

Figure 11:
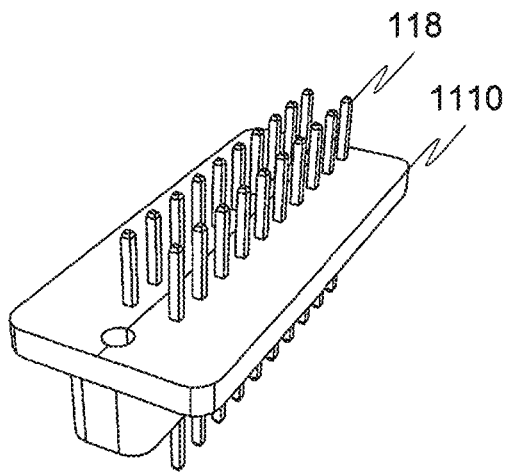
FIG. 11 illustrates a further embodiment of a connector applicable in conjunction with a multilayer structure disclosed herein.

FIG. 11 illustrates, at 1100, a further embodiment of a connector 1110 applicable in conjunction with a multilayer structure disclosed herein. The connector 1110 has a body from which multiple elongated contact elements, or at least the opposing ends of multiple elongated contact elements, 118 essentially of pin type extend substantially to two opposing directions.

Figure 12:
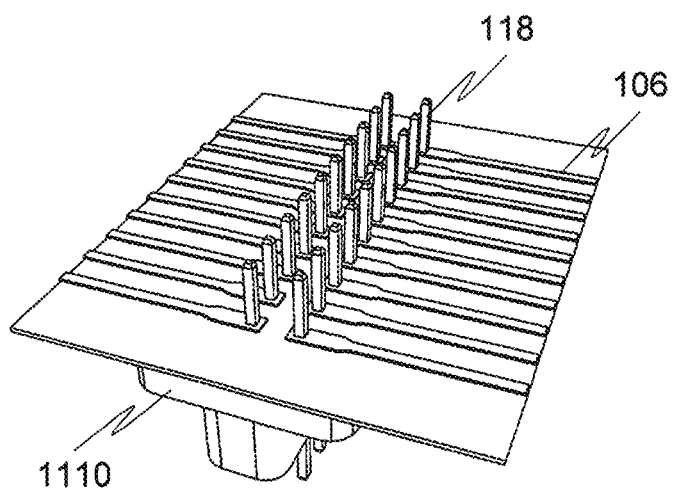
FIG. 12 depicts the connector of FIG. 11 as partially disposed through the substrate.

FIG. 12 depicts, at 1200, the connector 1110 of FIG. 11 as partially disposed through the substrate in terms of its contact elements 118 by, for instance, crimping, piercing and/or utilizing pre-prepared holes matching with the configuration such as spacing of the contact elements in the connector 1110.

Accordingly, physical and electrical connection to the conductive areas 106 on the substrate has been established.

Figure 13:
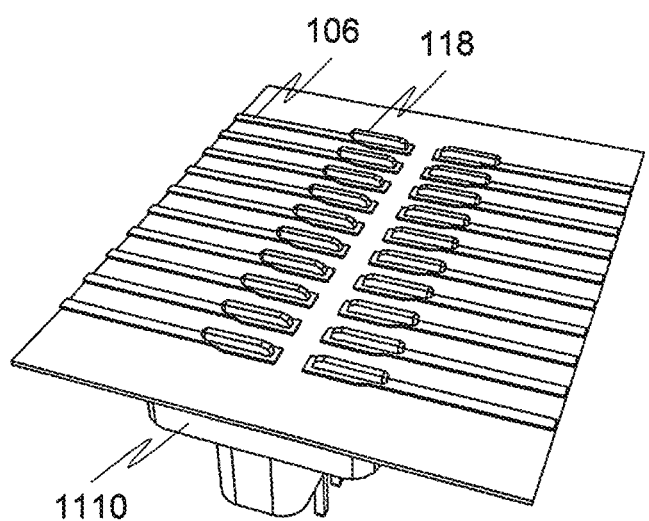
FIG. 13 depicts the connector of FIGS. 11-12 as partially disposed through the substrate, with the ends of the contact elements bent to extend in parallel with the substrate to enhance the contact with the conductive material upon the substrate.

FIG. 13 depicts, at 1300, the connector of FIGS. 11-12 with the ends of the contact elements 118 additionally bent so as to connect and follow the surface of the substrate provided with conductive areas 106 of conductive material. The shown solution may thus be utilized to enhance the electrical contact between the connector and circuit design on the substrate due to greater contact area in contrast to the basic solution of FIG. 12.

Figure 14:
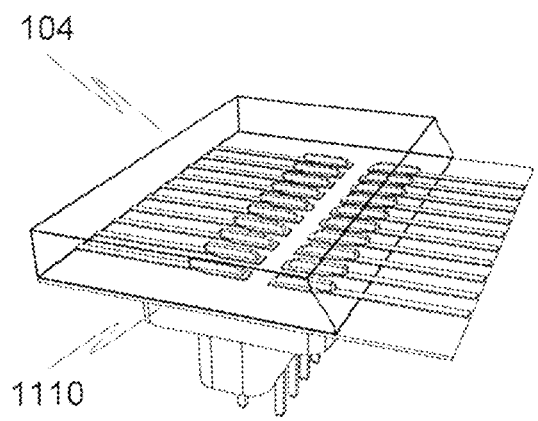
FIG. 14 illustrates the connector of FIG. 13 as partially disposed through the substrate having a plastic layer molded thereon, thereby essentially forming an embodiment of a multilayer structure discussed herein.

FIG. 14 illustrates, at 1400, the connector of FIG. 13 as partially disposed through the substrate having a plastic layer 104 molded thereon, thereby essentially forming an embodiment of multilayer structures generally discussed herein.

Figure 15:
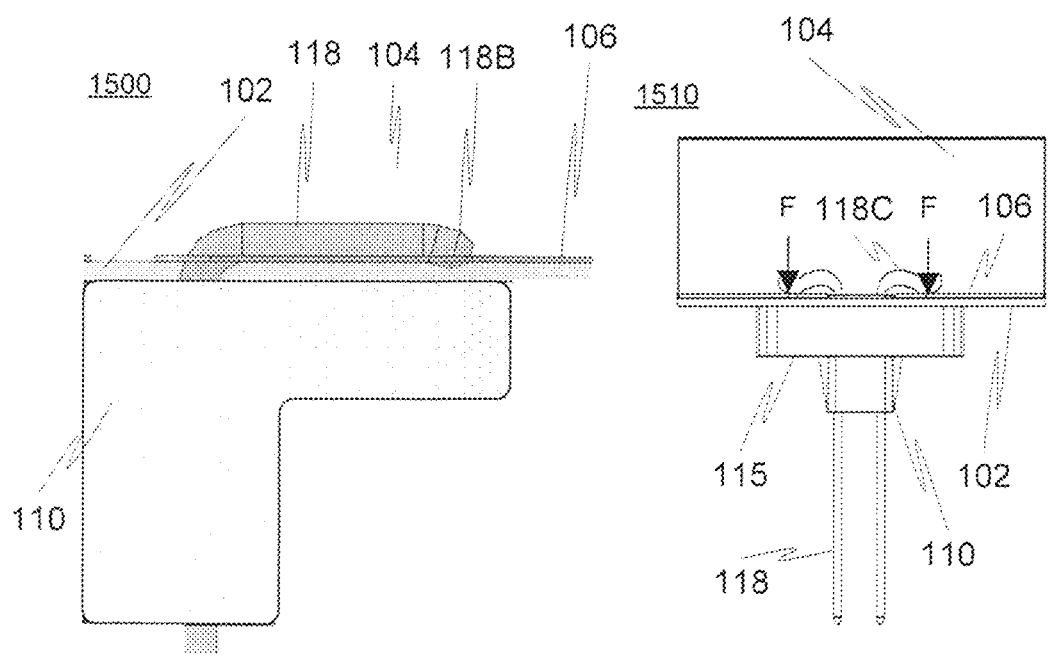
FIG. 15 provides a closer look at the contact between the conductive area on a substrate and two embodiments of a contact element, essentially a bent pin, of a connector applicable in conjunction with the present invention.

FIG. 15 provides, at 1500 and 1510, a closer look at optimizing the contact between the conductive areas on a substrate and different, still merely exemplary, embodiments of a contact element (e.g. a bent, angled pin) applicable for use in various connector elements 110 of the present invention.

On the left, at 1500, a contact element 118 such as a pin is shown as bent, see end 118B, and crimped or generally pressed towards the substrate 102 so as to establish an angled shape and effectively exert e.g. a spring type force on the substrate 102 (compressive force towards the substrate 102) and especially on the conductive area(s) 106 thereon to enhance and secure the physical and electrical contact established. Preferably, e.g. metallic or other electrically conductive material of the contact element 118 is selected so that undesired rebound effect from the substrate/conductive area is omitted or at least reduced.

On the right, at 1510, shown two contact elements 118 of the connector 110 essentially define springs 118C exerting compressive force, see arrows F, upon the substrate/conductive area(s) 106.

Yet, an embodiment of a counterpart/locking element, or locking frame, 115 is shown, which may be utilized together with spring type contact elements or in isolation therefrom to further secure the connector element 110 to the substrate 102. In some embodiments, the very same counterpart/locking element 115 may further define a locking and/or alignment feature for the external connector as discussed hereinearlier.

Figure 16:
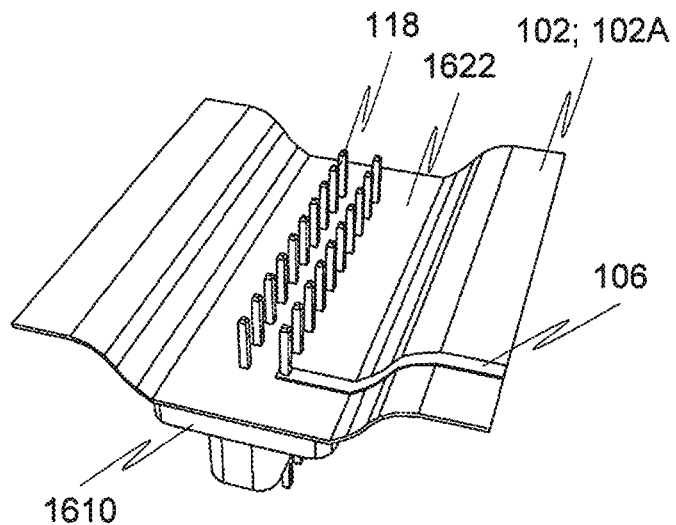
FIG. 16 illustrates still a further embodiment of a connector applicable in conjunction with a multilayer structure disclosed herein, positioned on a substrate so that the contact elements thereof extend through the substrate and connect to conductive area at least on the opposite side of the substrate.

FIG. 16 illustrates, at 1600, still a further embodiment of a connector element 1610 applicable in conjunction with a multilayer structure disclosed herein, positioned on a substrate so that the contact elements 118 thereof protruding from a body extend through the substrate 102 and connect to conductive area 106 at least on the opposite side of the substrate.

Figure 17:
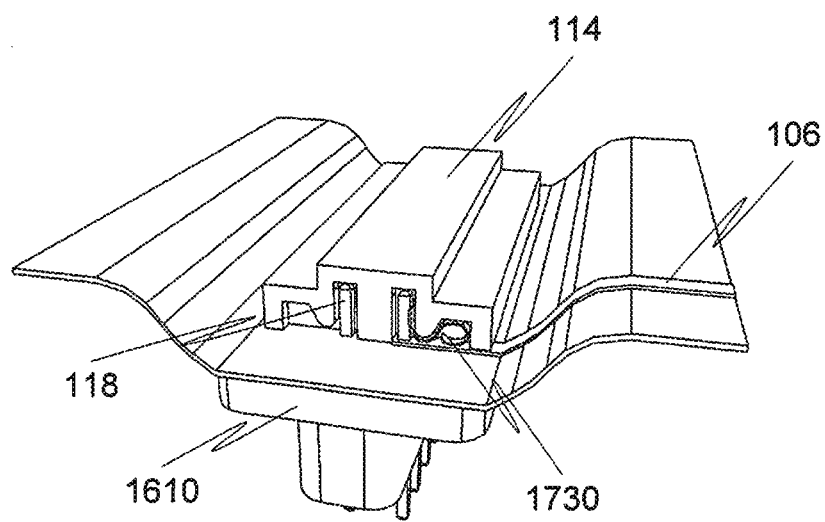
FIG. 17 depicts the connector of FIG. 16 with a counterpart element, incorporating preferably springy members, provided thereon on the opposite side of the substrate.

In this embodiment, which is also applicable to other discussed embodiments, the substrate film 102 has been formed to contain an elongated recess/protrusion or pocket shape 1622, substantially matching the location of the connector 1610. The recess/protrusion 1622 may accommodate at least a portion of the connector 1610 and e.g. a counterpart/locking element 114 thereof, which is shown at 1700 in FIG. 17.

The counterpart element 114 may be configured to secure and/or enhance the electrical coupling of the connector 1610 relative to the substrate 102 and e.g. conductor areas 106 thereon. The counterpart element 114 may comprise a number of springy members, essentially defining e.g. leaf or other type of springs, 1730 for the purpose.

The counterpart element 114 has been depicted via a partial cutaway representation, i.e. with end shell portion removed, but in practice it may comprise solid top, sides and/or ends of suitable material, such as plastic or ceramic material, while accommodating a number of connection enhancing, potentially springy, members 1730, which connect to the contact elements 118 via at least partially open bottom of the element 114.

At least one plastic layer may be molded upon the counterpart element 114 and related side of the substrate 102 for securing and protection purposes, for instance (not explicitly shown). Additionally, the opposing side of the substrate 102 could be provided with molded plastics layer.

Figure 19:
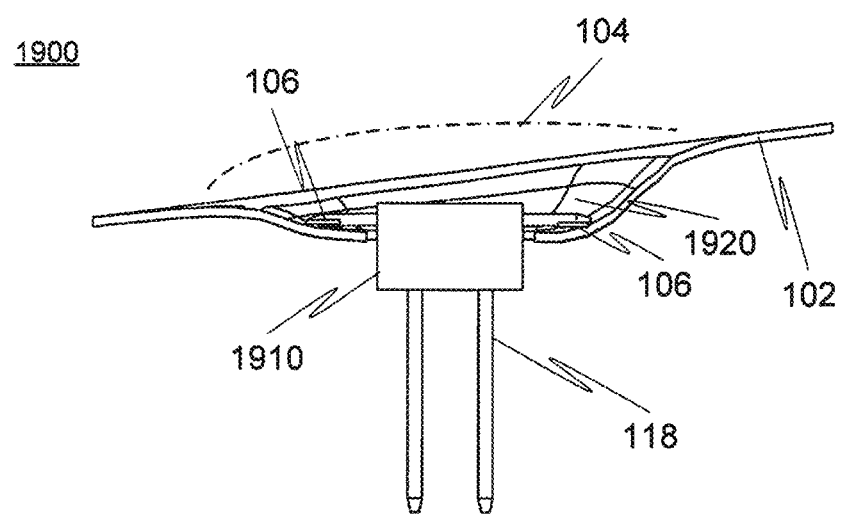
FIG. 19 illustrates a further embodiment of a connector and related multilayer structure in accordance with the present invention.

FIG. 19 illustrates, at 1900, a further embodiment of an essentially rigid connector 1910 and related multilayer structure in accordance with the present invention. At least a portion of the connector 1910 may be positioned in a 3D-formed feature 1920 (or the forming may occur subsequent to positioning the connector 1910 on the substrate 102), e.g. a recess or 'pocket', of the substrate film 102, which may be subsequently overmolded by plastics 104.

The shown design incorporates a hole, or specifically e.g. a cut-out, in the film 102 through which the connector 1910 and e.g. contact elements 118 thereof protrude and extend towards the environment.

The electrically conductive areas 106 of the circuit design may define conductor traces/contact area of e.g. conductive ink to enable connection to the connector 1910 and therethrough, to external system, device or structure. The contact elements 118 such as pins of the connector 1910 are preferably configured (angled or bent, for instance; see the right angle of the pins in the figure) such that they are parallel with the film 102 and e.g. conductive areas 106 in the pocket in favour of enhanced electrical coupling and/or reduced height on the substrate 102, for example.

In this and other embodiments, the connector 1910 can be attached via standard pick and place methods and equipment. Attaching materials may be determined embodiment-specifically. E.g. a custom tooling jig may be designed to allow for the proper part placement an also allow for the part to go through the curing process.

Optionally, in the shown and other embodiments selected encapsulant such as resin or specifically adhesive (e.g. epoxy or glue) may be applied or dispensed over the contact elements, such as pins, of the connector 1910 to ensure secure attachment during the molding process. The encapsulant may be thus provided e.g. on the side of the molded plastics 104. Electrical coupling between the contact elements 118 and conductive areas 106 may be further enhanced by using conductive adhesive such as conductive epoxy. Alternatively or additionally, protective and/or securing material may be provided to the opposing side of the substrate 102 for the connector 1910 with reference to e.g. encapsulant or a further molded layer. In some embodiments, the external connecting element may be connected to (mated with) the connector 1910 prior to provision of such further material to protect and/or secure also the external connecting element relative to the substrate 102 and connector 1910.

Figure 20:
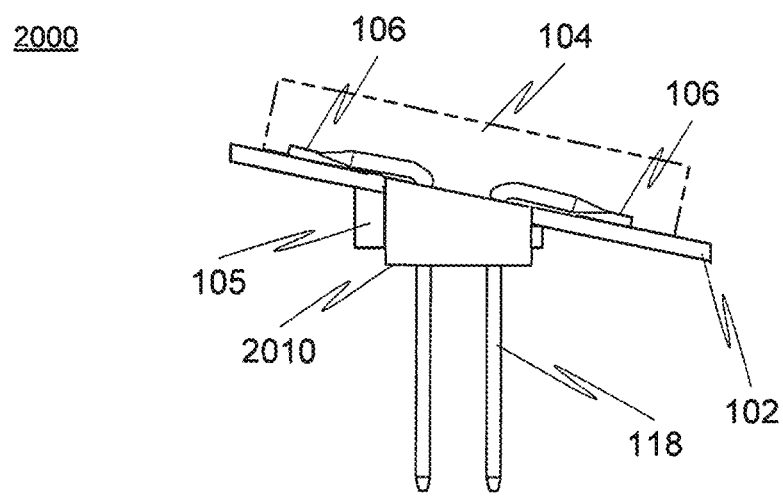
FIG. 20 illustrates still a further embodiment of a connector and related multilayer structure in accordance with the present invention.

FIG. 20 illustrates, at 2000, a further embodiment of a connector 2010 and related multilayer structure in accordance with the present invention. The connector 2010 may be custom-made or custom-shaped to exhibit a desired curved, slanted or angled surface e.g. in its body member. Such curved or angled surface may be designed to follow the contour of a selected greater design, such as the surface of the substrate 102, which may be preferred to maintain the related surface even (flat) or its thickness constant, for example. Again, the substrate film 102 may comprise a through-hole to enable the connector to at least partially slip through. The connector 1910 may be placed using applicable equipment and method such as the aforesaid pick and place type solution. A custom tooling jig may be designed to allow for the proper part placement or to allow for the part to go through the remaining process.

What comes to the potential usage of encapsulants, electrically conductive adhesives, multiple molded layers, etc., the above comments regarding the embodiment of FIG. 19 are also applicable here.

Figure 21A:
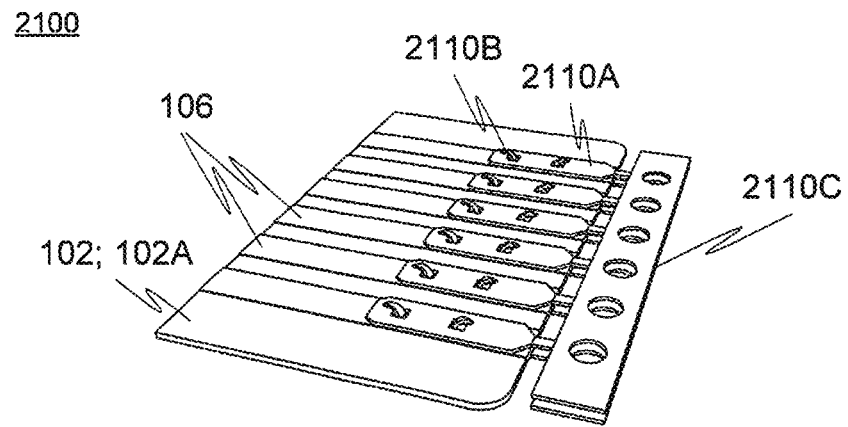
FIG. 21A illustrates one more embodiment of a connector and substrate of a multilayer structure in accordance with the present invention.

FIG. 21A illustrates, at 2100, one more embodiment of a connector and substrate of a multilayer structure in accordance with the present invention.

In this and similar embodiments (see also FIGS. 4B-4D and 5B, for instance), the connector may at least originally be essentially of multipart type, where at least two initially separate parts have been positioned on different sides of a substrate and connected together. Alternatively, the connector could consist of an element or at least contain a part provided with essentially 'U' shape profile, accommodating the substrate between the side wall-defining portions thereof.

As contemplated hereinbefore, so-called counterpart elements such as locking frames may be utilized with the connectors. The counterpart elements may contain electrically insulating material and optionally also conductive features such as springy members. However, in the embodiment of FIG. 21A, the connector structure is established from at least two preferably conductive, opposite (oppositely configured) contact portions or parts 2110A, 2110B, essentially halves, which optionally further define, either in combination or by either of them, a coupling or connecting portion 2110C for an external connecting element in the form of a projection or protrusion extending e.g. sideways from the substrate 102 and from the overall multilayer stack.

The portion 2110C could thus enable connecting the external connecting element of external structure, device or system to the multilayer structure of the present invention and be located essentially adjacent to the substrate 102 instead or in addition to connecting features provided by the connector directly upon any side 102A, 102B of the substrate 102. The portion 2110C extends over the edge of the substrate 102. The portion 2110C may define a number of connecting features such as holes (shown) or protrusions for the external connecting element. In case the portion 2110C is defined by both portions 2110A, 2110B, it may further connect the two portions 2110A, 2110B together in addition to or instead of coupling actualized through the substrate 102. Alternatively or additionally, the portion 2110C could be used as an installation tool to, among other potential uses, align the parts 2110A, 2110B, for example, and removed afterwards, for example.

A first portion 2110A may define one or more conductive contact areas e.g. in the form of conductive strips or plates. The first portion 2110A may thereby be substantially planar and/or elongated, for example. The contact areas may be configured to contact conductive traces 106 of the circuit design on the substrate 102. A second, opposing part 2110B on the other side of the substrate 102 may further define one or more conductive areas e.g. in the form of strips. Such areas may be configured to contact conductive traces 106 provided on the substrate 102 (if any).

The second part 2110B, which may generally be of e.g. planar and/or elongated shape, preferably defines a number of conductive protrusions such as barbed, spike-like and/or curved protrusions. Such protrusions may be configured to, responsive to e.g. crimping or other installation action, penetrate through the materials of the substrate 102 and e.g. printed conductors/conductive areas 106 of a circuit design thereon and/or enter ready-made through-holes therein, and connect to the opposing first part 2110A while also going through it (piercing through or entering pre-prepared holes).

Generally, the conductors 106 may be provided on either or both sides 102A, 102B and associated surfaces of the substrate 102. The shown connector structure may thus be configured to connect the conductors on both sides together, when applicable, in addition to providing electrical connectivity to external systems and devices. Instead of or in addition to crimping, e.g. laser beam or spot welding could be applied to couple the parts 2110A, 2100B. Subsequently, the obtained structure may be provided with further features such as molded layers on any side thereof.

Figure 21B:
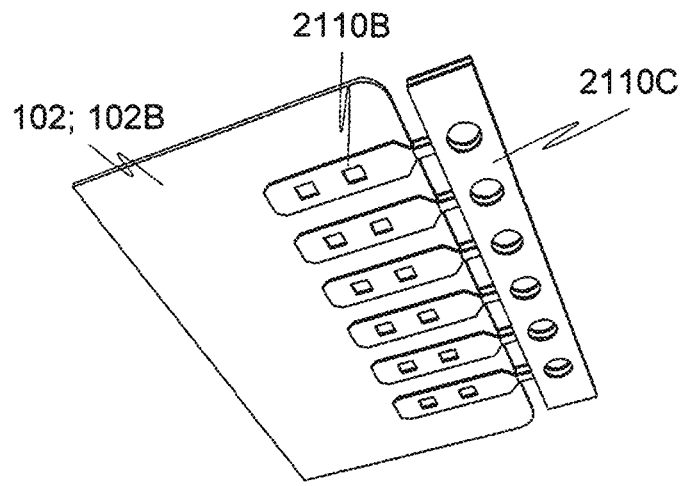
FIG. 21B illustrates the embodiment of FIG. 21A from alternative angle.

FIG. 21B illustrates the embodiment of FIG. 21A from another angle, depicting the second side 102B of the substrate 102. In this example, the second side 102B has not been provided with conductive areas to connect to the second part 2110B of the connector, but as alluded to above, in other embodiments the second side 102B could additionally contain conductive areas contacting the part 2110B. In some further embodiments, solely the second side 102B of the substrate 102 could be provided with conductive contact areas for the connector.

Figure 22:
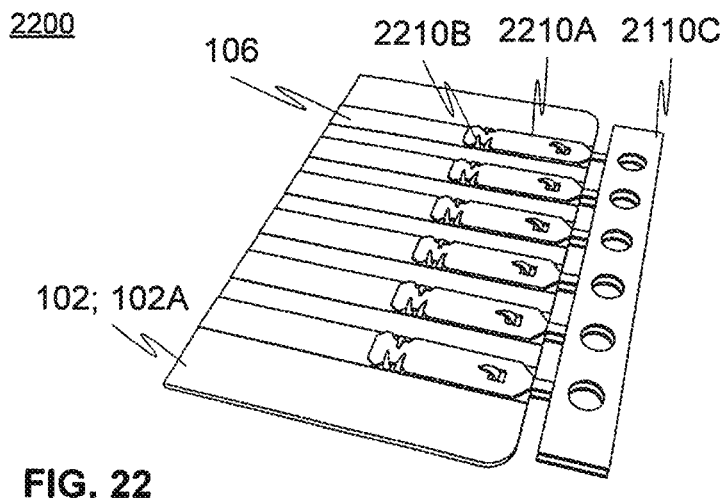
FIG. 22 illustrates a further embodiment of a connector and substrate of a multilayer structure in accordance with the present invention.

FIG. 22 illustrates, at 2200, a further embodiment of a connector and related substrate of a multilayer structure in accordance with the present invention. Generally, comments regarding the above embodiment are applicable also here. One difference resides in that whereas in the solution of FIGS. 21A and 21B, the protrusions of connector part 2110B went through the substrate 102 and conductive areas (conductors) 106, here not all the protrusions of part 2110B are directed through the conductors 106 or part 2210A as some of them connect to the part 2110A and optionally conductors 106 essentially from the sides thereof, thus merely going through the substrate 102 but substantially not e.g. the conductors 106. In some embodiments, piercing the conductors 106 or providing ready-made holes therein to accommodate protrusions of the connector could be completely avoided by such configuration. Accordingly, coupling area between the connector and the conductors 106 could be maximized and establishing through-holes in the conductors 106 minimized. In some embodiments, at locations corresponding to the protrusions of part 2110B, the part 2110A could still be provided with a number of features such as recesses or indents (embodiment of which being shown in the figure) to accommodate and optionally better secure the protrusions and thus part 2110A.

The connectors of the embodiments of FIGS. 21A, 21B, 22 and various other embodiments discussed herein may be alternatively, instead of edges, located elsewhere, e.g. closer to or essentially at the center of the substrate film 102, as being apprehended by a person skilled in the art.

Figure 23:
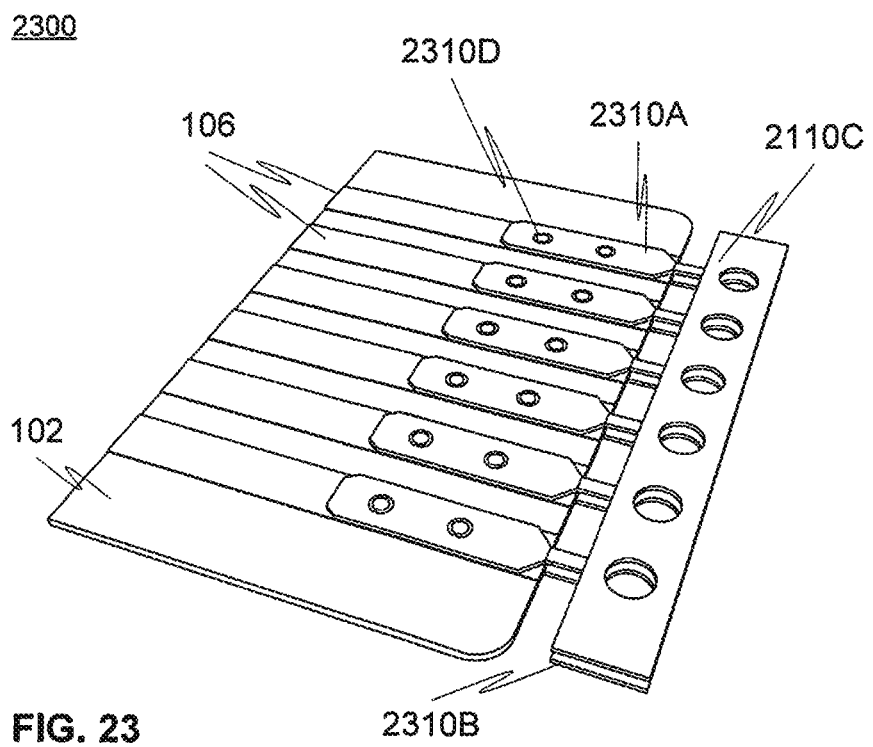
FIG. 23 illustrates a further embodiment of a connector and substrate of a multilayer structure in accordance with the present invention.

FIG. 23 illustrates, at 2300, a further embodiment of a connector and related substrate of a multilayer structure in accordance with the present invention. The above comments generally apply with a distinction that here the stacked connector portions 2310A, 2310B have been connected together by features 2310D extending through the substrate 102 and preferably established by welding such as spot welding or laser beam welding. Accordingly, the portions 2310A, 2310B preferably exert compressive pressure upon the intermediate substrate 102 and conductors 106 thereon to enhance the connection therebetween. The connector may further define the side extension 2110C.

Figure 24:
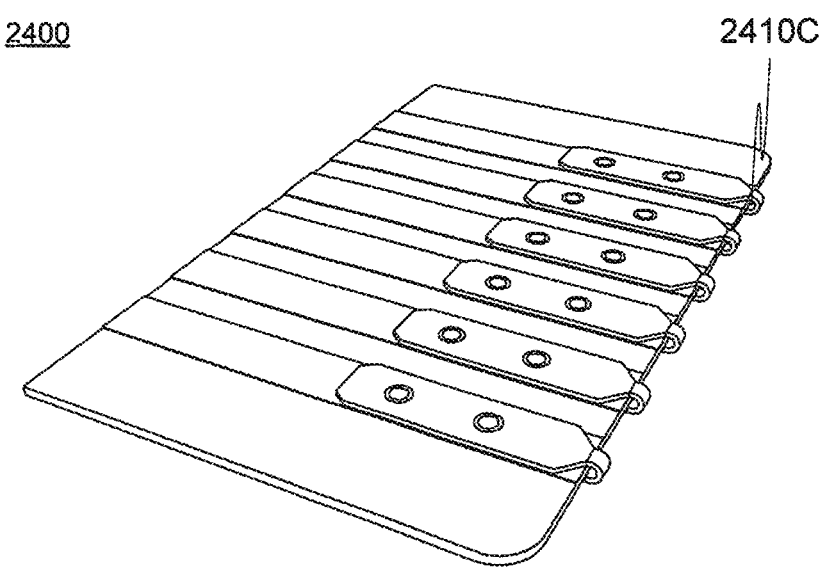
FIG. 24 depicts a further embodiment of a connector and substrate of a multilayer structure in accordance with the present invention.

FIG. 24 depicts, at 2400, a further embodiment and variation of a connector and related substrate of a multilayer structure in accordance with the present invention. Generally, comments regarding the above embodiments are applicable also here. Now, the opposite planar portions or parts of the connector are connected together, besides e.g. via the feature(s) directed through the substrate, also via connecting intermediate, e.g. 'U'-shaped, bridge portions 2410C extending from a side of the substrate to another over the edge (border) of the substrate as shown, preferably in contact or at least in close proximity with the edge. The opposite portions of the connector and intermediate bridge portion may be monolithic by nature.

Figure 25A:
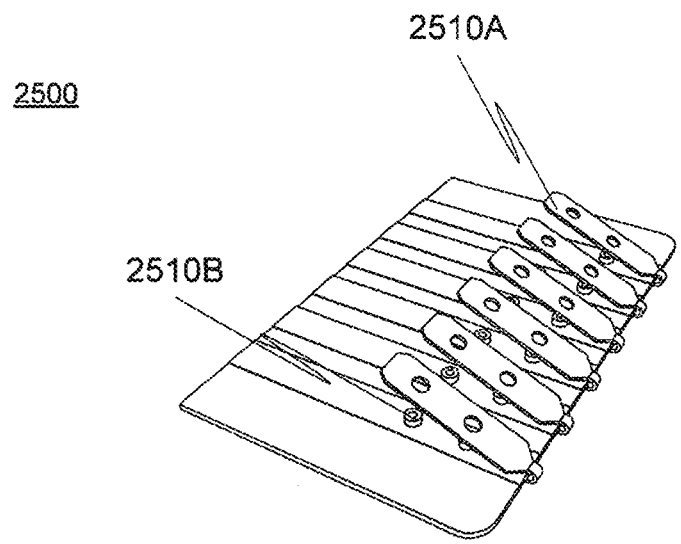
FIG. 25A illustrates an embodiment of a connector and substrate of a multilayer structure according to the present invention upon their mutual configuration and installation.
Figure 25B:
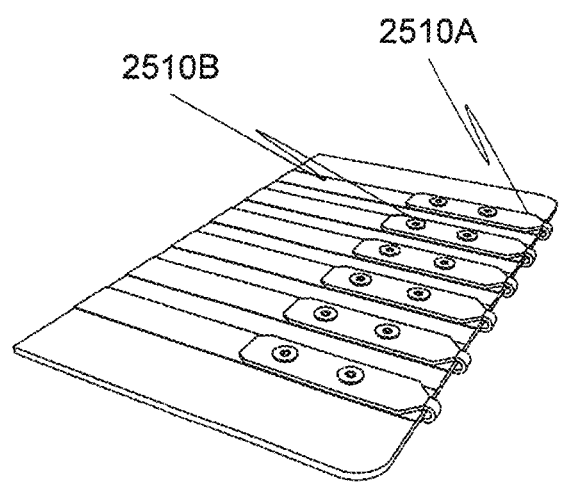
FIG. 25B illustrates the embodiment of FIG. 25A after installation.

FIG. 25A illustrates, at 2500, an embodiment of a connector and substrate of a multilayer structure according to the present invention. Generally, comments regarding the above embodiment are applicable here. The second portion or part 2510B of the connector (the connector may be monolithic and initially define e.g. an 'A' or arc shape) has been provided with protrusions, such as pins, rivets or studs, directed through the substrate so that the first portion or part 2510A provided with compatible recesses such as through-holes established therein can be then secured thereto by applicable action, such as pressing or crimping action, so that the portion 2510A subsequently extends substantially along the surface of the substrate as shown in FIG. 25B. In this and other embodiments, additional fastening options for securing the connector to the substrate, conductor thereon, or several connector portions/parts together, are fully applicable as well, with reference to various electrically non-conductive or conductive adhesives, for instance.

Figure 18:
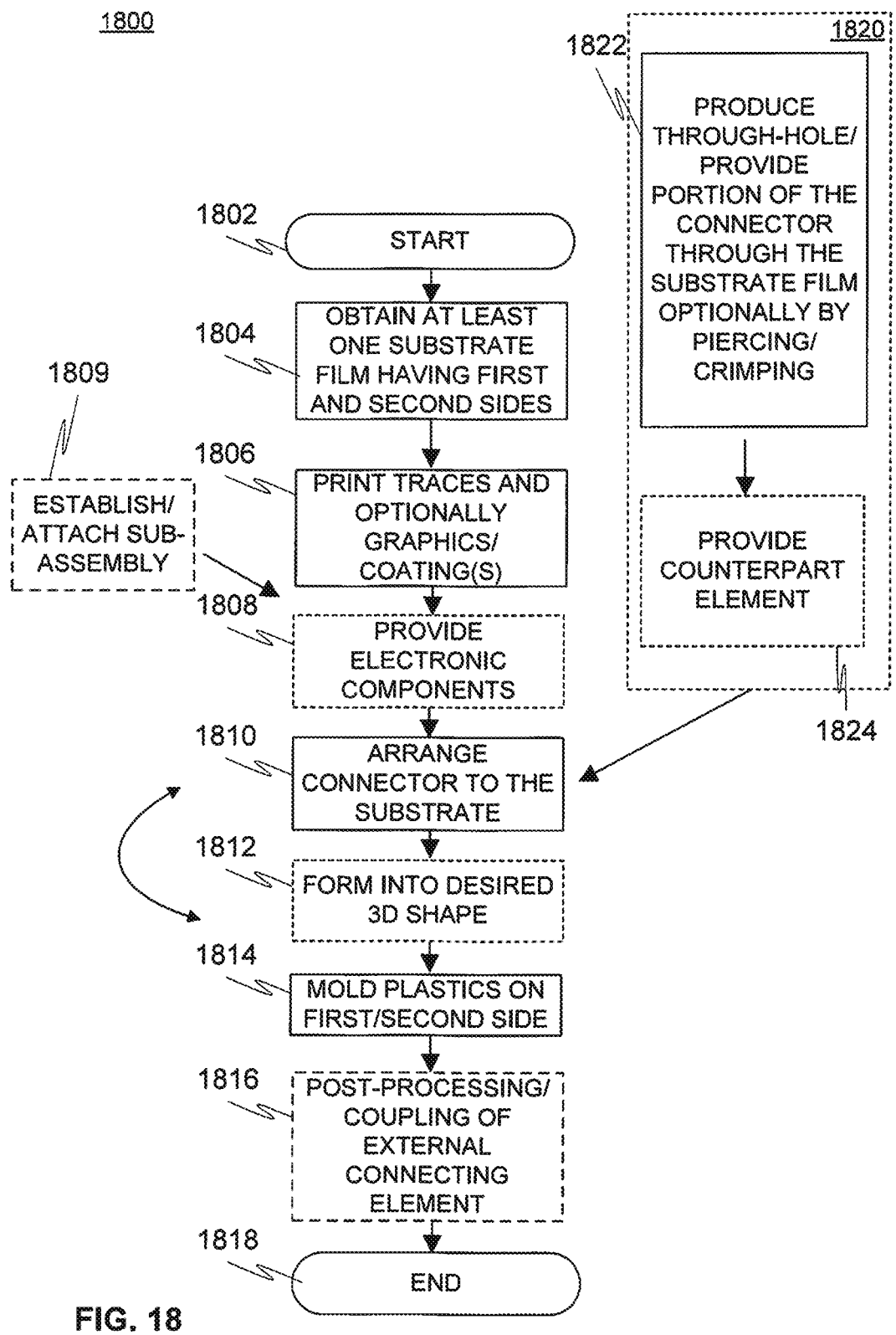
FIG. 18 is a flow diagram of an embodiment of a method in accordance with the present invention.

FIG. 18 includes, at 1800, a flow diagram of an embodiment of a method in accordance with the present invention.

At the beginning of the method for manufacturing the multilayer structure, a start-up phase 1802 may be executed. During start-up, the necessary tasks such as material, component and tools selection, acquisition, calibration and other configuration tasks may take place. Specific care must be taken that the individual elements and material selections work together and survive the selected manufacturing and installation process, which is naturally preferably checked up-front on the basis of the manufacturing process specifications and component data sheets, or by investigating and testing the produced prototypes, for example. The used equipment such as molding/IMD (in-mold decoration), lamination, bonding, (thermo)forming, electronics assembly, cutting, drilling and/or printing equipment, among others, may be thus ramped up to operational status at this stage.

At 1804, at least one, optionally flexible, substrate film of plastics or other material for accommodating electronics is obtained. The substrate film may initially be substantially planar or e.g. curved. A ready-made element, e.g. a roll or sheet of plastic film, may be acquired for use as the substrate material. In some embodiments the substrate film itself may be first produced in-house by molding or other methods from selected starting material(s). Optionally, the substrate film may be processed further at this stage. It may be, for example, provided with holes, notches, recesses, cuts, etc. as contemplated hereinbefore.

At 1806, a number of conductive areas defining e.g. conductor lines (traces) and/or contact pads to construct a circuit design are provided on the substrate film(s), either or both sides thereof, preferably by one or more additive techniques of printed electronics technology. For example, screen, inkjet, flexographic, gravure or offset lithographic printing may be utilized. Also further actions cultivating the film(s) involving e.g. printing or generally provision of graphics, visual indicators, optical elements, etc. thereon may take place here.

At 1808 (optional), one or more typically ready-made components including electronic components such as various SMDs may be attached to the contact areas on the film(s) e.g. by solder and/or adhesives. Alternatively or additionally, printed electronics technology may be applied to actually manufacture at least part of the components, such as OLEDs, directly onto the film(s). Accordingly, the execution of items 1806, 1808 may temporally overlap as being understood by a skilled person.

Item 1810 refers to provision of an electrical connector to the substrate, potential phases of a corresponding procedure being illustrated at 1820 in more detail. The connector may be provided to the substrate utilizing any feasible positioning or installation technique such as standard pick and place method/equipment (when applicable). Applicable bonding (using e.g. adhesive or other bonding substance), gluing, and/or further securing techniques may be additionally utilized.

At 1822, as discussed hereinbefore a number of pre-prepared through-holes or at least thinned portion(s) may be arranged in a hosting substrate film so that a portion of the connector such as part of the body and/or electrical contact elements, e.g. pins, thereof may be directed through them to establish a contact with the circuit design. In some embodiments, in addition to or instead of using pre-prepared hole(s), the necessary hole(s) may be dynamically established upon piercing the substrate by e.g. contact elements of the connector responsive to a crimping or other suitable method. The connector may be configured to contact the circuit design on either or both sides of the substrate film.

The procedure may further involve bending e.g. the ends of the contact elements so as to extend substantially parallel to the surface of the film and conductive area thereon (if not actually slightly slanted towards it) and/or perpendicular thereto to better interface with an external connector, for example, depending on the embodiment.

Yet, in some embodiments as discussed hereinbefore, in addition to or instead of providing the connector or a portion thereof physically through the substrate film, the connector may comprise e.g. two portions or parts (initially separate or integral) on opposing sides of the substrate that are joined together by at least one intermediate feature (e.g. one bridging feature or e.g. two connecting, lateral extensions on each side of the substrate), extending from one side of the substrate to the other side, over the edge thereof. Such arrangement thus enables the connector structure to at least functionally extend through the substrate, if not directly physically through it via e.g. a hole.

At 1824, at least one optional counterpart/locking element, such a locking frame, may be installed to enhance securing the connector to the substrate (e.g. from a direction/on a substrate side/surface opposite to the initial installation direction/installation side of the connector) and possibly enhance its electrical contact with the circuit design on the substrate by means of included, electrical contact enabling or enhancing members such as springy members, with reference to leaf springs discussed hereinbefore.

Item 1809 refers to possible attachment of one or more sub-systems or 'sub-assemblies' that may incorporate an initially separate, secondary substrate provided with electronics such as IC(s) and/or various components. At least part of the electronics of the multilayer structure may be provided to the substrate film(s) via such sub-assembly. Optionally, the sub-assembly may be at least partially overmolded by a protective plastic layer prior to attachment to the main substrate. For example, adhesive, pressure and/or heat may be used for mechanical bonding of the sub-assembly with the primary (host) substrate. Solder, wiring and conductive ink are examples of applicable options for providing the electrical connections between the elements of the sub-assembly and with the remaining electrical elements on the primary substrate. Item 1809 could also be executed e.g. upon item 1806 or 1810. The shown position thereof is primarily exemplary only.

In some embodiments, prior to or upon the molding phase the substrate film(s) preferably already containing e.g. at least part of the circuit design, such as printed conductive areas and optionally electronic components, and/or the connector (see the bi-directional curved arrow highlighting the fact that forming could alternatively or additionally take place e.g. between items 1808 and 1810, or even prior to item 1806 or 1808) may be formed 1812 using thermoforming or cold forming, for instance, to exhibit a desired shape such as desired three-dimensional (essentially non-planar) shape. The substrate containing suitable formable material may therefore be shaped to better fit the target environment/device and/or to better accommodate features such as the electrical connector as explained hereinbefore with reference to several examples (recesses/"pockets"). Additionally or alternatively, forming could take place after molding in case the already-established multilayer stack is designed to survive such processing.

At 1814, at least one plastic layer, preferably thermoplastic layer, is molded upon said first and/or second sides of the substrate film so as to preferably at least partially embed the electrical connector element in the molded material. For example, the molded plastics may optionally fully embed e.g. that portion of the electrical connector element that resides on a side of the substrate film facing away from the external connector when mated with the multilayer structure. Instead, on a side of the substrate that is intended to face and receive the external connector, the remaining portion of the electrical connector may remain free from molded plastics or be embedded therein only to an extent that does not prevent connecting the external connector to the multilayer structure therethrough. As discussed hereinbefore, in case molded material is provided upon both sides of a substrate film, it may be provided using several molding steps or shots, or via a single step, wherein molded material flows through the film from one side thereof to the opposing side via a hole prepared therein or by penetrating through the substrate material itself, for example.

In practice, the substrate film may be used as an insert in an injection molding process. One side of the substrate film may be, in some embodiments, left free from the molded plastics.

In case, two films are used, both of them may be inserted in their own mold halves so that the plastic layer is injected between them. Alternatively, the second film could be attached to an aggregate of the first film and plastic layer afterwards by suitable lamination technique.

Regarding the resulting overall thickness of the obtained stacked multilayer structure, it depends e.g. on the used materials and related minimum material thicknesses providing the necessary strength in view of the manufacturing and subsequent use. These aspects have to be considered on case-by-case basis. For example, the overall thickness of the structure could be about 1 mm or a few millimetres, but considerably thicker or thinner embodiments are also feasible.

Item 1816 refers to possible post-processing tasks. Further layers may be added into the multilayer structure by lamination or suitable coating (e.g. deposition) procedure. The layers may be of protective, indicative and/or aesthetic value (graphics, colors, figures, text, numeric data, etc.) and contain e.g. textile, leather or rubber materials instead of or in addition to further plastics. Additional elements such as electronics may be installed at the outer surface(s) of the structure, such as the exterior surface of the substrate. Shaping/cutting may take place. The connector element may be connected to a desired external connecting element such as external connector of an external device, system or structure. For example, these two connectors may together form a plug-and-socket type connection.

Following connecting of the external connecting element to the internal, integral connector element of the multilayer structure, the established connection and related elements may be further secured and/or protected by additional processing, such as low pressure molding of plastics or resin dispensing (epoxy), whereupon the resulting layer may at least partially encapsulate desired elements in the connection region, for example. Low pressure molding or resin dispensing may be exploited to protect and/or secure also other elements, such as electrical elements, of the structure.

At 1818, method execution is ended.

The scope of the present invention is determined by the attached claims together

The invention claimed is:

1. An integrated multilayer structure comprising:
   a substrate film having a first side and an opposite second side, said substrate film comprising electrically substantially insulating material,
   a circuit design comprising a number of electrically conductive areas of electrically conductive material, optionally defining contact pads and/or elongated conductor traces, preferably printed by printed electronics technology, on said first and/or second sides of the substrate film,
   a connector comprising:
      a number of electrically conductive, optionally elongated, contact elements; and
      an electrically insulating body member accommodating said number of electrically conductive contact elements, said connector being provided to the substrate film so that the body member thereof extends through both said first and second sides of said substrate film and said number of electrically conductive contact elements connect to one or more of the conductive areas of the circuit design, at least a first end of the contact elements extending in parallel relation with the substrate film to enhance contact with the electrically conductive material disposed upon the substrate film, the contact elements being further configured to electrically couple to an external connecting element responsive to mating the external connecting element with the connector on said first or second side of or adjacent to the substrate film, and at least one plastic layer, preferably of thermoplastic material, molded onto said first and/or second side of the substrate film so as to fully embed a portion of the body member of the connector that is on a side of the substrate facing away from an opposing connection side of the external connecting element, and enhance securing of the connector to the substrate film.

2. The integrated multilayer structure of claim 1, wherein said circuit design further comprises:
a number of electronic components, such as mounted and/or printed components, at least electrically connected to one or more of the number of electrically conductive areas.

3. The integrated multilayer structure of claim 1, wherein said circuit design further comprises:
a connecting component, including a bridge, a circuit and/or other device, configured to connect multiple contact elements such as pins together, to enable high current flow via them.

4. The integrated multilayer structure of claim 1, wherein the body member contacts said first or second side of the substrate film.

5. The integrated multilayer structure of claim 1, wherein the connector is substantially rigid and preferably comprises:
one or more bent or angled contact elements in said number of contact elements.

6. The integrated multilayer structure of claim 1, wherein a plastic layer of said at least one plastic layer at least partially covering the connector is located on one side of the substrate film, and a portion of the connector to contact the external connecting element is located on the opposite side of the substrate film.

7. The integrated multilayer structure of claim 1, further comprising:
a number of elastic, mechanical locking members defined by the at least one plastic layer and configured to contact the external connecting element when mated to enhance securing the external connecting element to the connector.

8. The integrated multilayer structure of claim 1, wherein at least a portion of the connector is established by said at least one plastic layer.

9. The integrated multilayer structure of claim 1, wherein the connector defines a number of barbed protrusions entering into the said at least one plastic layer, said protrusions being defined by the contact elements of the connector.

10. The integrated multilayer structure of claim 1, wherein there are electrically conductive areas of the circuit design on one or both of said first and second sides of the substrate, said connector directly electrically connecting to the areas on one or both sides via said number of contact elements, a single contact element directly mechanically and electrically connecting to the areas on said both sides.

11. The integrated multilayer structure of claim 1, wherein said substrate film defines at least one pre-prepared through-hole configured to accommodate a portion of the connector extending to said first and/or second sides of the film therethrough.

12. The integrated multilayer structure of claim 1, wherein said substrate film defines at least one, connector-created through-hole via which a portion of the connector has been configured to protrude from said first or second side to the opposite second or first side, respectively.

13. The integrated multilayer structure of claim 11, wherein one or more dimensions of a surface area or cross-sectional area of the connector facing the substrate film are larger than the diameter of the at least one through-hole so that the connector does not fully fit through said at least one through-hole.

14. The integrated multilayer structure of claim 1, wherein at least one of the contact elements is configured to exert compressive force, through spring force, on at least one electrically conductive area of the circuit design.

15. The integrated multilayer structure of claim 1, wherein at least one, elongated, contact element of said number of contact elements of the connector is substantially defining an L-profile, so that on one side of the substrate film a second end of the contact element extends substantially perpendicular to the surface of the film to connect with the external connecting element while on the opposite side of the substrate film the first end of the contact element extends substantially parallel to the substrate film, contacting the electrically conductive area of said number of conductive areas of the circuit design thereon.

16. The integrated multilayer structure of claim 1, comprising:
a counterpart element removably attached to the connector, to enhance securing of the connector to the substrate film and to secure and/or guide the external connecting element relative to the integral connector element.

17. The integrated multilayer structure of claim 16, wherein the counterpart element comprises:
at least one springy member of electrically conductive material, contacting both at least one contact element of the connector and at least one conductive area of the substrate film to enhance electrical coupling between the two.

18. The integrated multilayer structure of claim 16, wherein the counterpart element defines a surface area facing the substrate film, greater than an area defined by one or more through-holes of the substrate film through which the connector extends.

19. The integrated multilayer structure of claim 1, wherein the substrate film defines a recess accommodating a portion of the connector and having a through-hole at a bottom thereof, via which the connector extends through the substrate film.

20. The integrated multilayer structure of claim 1, wherein the connector comprises, in its a body member, an angled, slanted or curved surface, the connector being configured relative to the substrate so that said angled, slanted or curved surface substantially aligns with the adjacent surface of the substrate.

21. The integrated multilayer structure of claim 1, comprising:
a mechanical sealing member on an area of the substrate film configured to receive the external connecting element to provide a hermetic seal between the substrate film and said external connecting element placed thereon.

22. The integrated multilayer structure of claim 1, wherein the connector defines a crimp connection to the circuit design on the substrate film.

23. The integrated multilayer structure of claim 1, wherein the substrate film is essentially planar or exhibits at least locally an essentially three-dimensional shape.

24. The integrated multilayer structure of claim 1, wherein the circuit design further comprises:
a number of components at least partially embedded within the molded at least one plastic layer.

25. The integrated multilayer structure of claim 1, wherein the connector further comprises:
a number of electronic and/or connecting components.

26. The integrated multilayer structure of claim 1, wherein the connector comprises a cavity at least partially filled with the molded plastic.

27. The integrated multilayer structure of claim 1, wherein the substrate film comprises:
at least one material selected from the group consisting of: polymer, thermoplastic material, electrically insulating material, PMMA (Polymethyl methacrylate), Poly Carbonate (PC), copolyester, copolyester resin, polyimide, a copolymer of Methyl Methacrylate and Styrene (MS resin), glass, Polyethylene Terephthalate (PET), carbon fiber, organic material, biomaterial, leather, wood, textile, fabric, metal, organic natural material, solid wood, veneer, plywood, bark, tree bark, birch bark, cork, natural leather, natural textile or fabric material, cotton, wool, linen, silk, other naturally grown material, and any combination of the above.

28. The integrated multilayer structure of claim 1, wherein the at least one plastic layer comprises:
at least one material selected from the group consisting of: elastomeric resin, thermoset material, thermoplastic material, PC, PMMA, ABS, PET, copolyester, copolyester resin, nylon (PA, polyamide), PP (polypropylene), TPU (thermoplastic polyurethane), polystyrene (GPPS), TPSiV (thermoplastic silicone vulcanizate), and MS resin.

29. The integrated multilayer structure of claim 1, wherein the electrically conductive areas comprise:
at least one material selected from the group consisting of: conductive ink, conductive nanoparticle ink, copper, steel, iron, tin, aluminium, silver, gold, platinum, conductive adhesive, carbon fibre, alloy, silver alloy, zinc, brass, solder, titanium, and any component thereof.

30. The integrated multilayer structure of claim 1, wherein the contact elements comprise:
at least one material selected from the group consisting of: copper, silver, gold, platinum, conductive adhesive, carbon fibre, zinc, brass, alloy, and silver alloy.

31. The integrated multilayer structure of claim 1, wherein said connector comprises:
at least one feature selected from the group consisting of: pin header, crimped connector, springy contact element, spring-loaded contact element, spring-loaded contact pin or slip, contact pad, contact area, contact pin, hole preferably with walls and/or bottom of conductive material, socket, female socket, male plug or socket, hybrid socket, pin socket, and spring pin socket.

32. The integrated multilayer structure of claim 1, comprising:
at least one feature, included in or at least electrically or otherwise operably connected to said circuit design, selected from the group consisting of: electronic component, electromechanical component, electro-optical component, radiation-emitting component, light-emitting component, LED (light-emitting diode), OLED (organic LED), side-shooting LED or other light source, top-shooting LED or other light source, bottom-shooting LED or other light source, radiation detecting component, light-detecting component, photodiode, phototransistor, photovoltaic device, sensor, micromechanical component, switch, touch switch, touch panel, proximity switch, touch sensor, atmospheric sensor, temperature sensor, pressure sensor, moisture sensor, gas sensor, proximity sensor, capacitive switch, capacitive button, capacitive sensor, projected capacitive sensor or switch, single-electrode capacitive switch or sensor, multi-electrode capacitive switch or sensor, self-capacitance sensor, mutual capacitive sensor, inductive sensor, sensor electrode, micromechanical component, UI element, user input element, vibration element, sound producing element, communication element, transmitter, receiver, transceiver, antenna, infrared receiver or transmitter, wireless communication element, wireless tag, radio tag, tag reader, data processing element, data storage element, electronic subassembly, light directing element, lightguide, lens, reflector, encapsulant material covering at least a portion of a contact element of the connector, electronic component or other feature on the substrate film, conductive adhesive securing a contact element of the connector or electronic component to the circuit design on the substrate, and adhesive securing the connector to the substrate.

33. A system comprising the integrated multilayer structure of claim 1 and a device comprising the external connecting element to connect to the integrated multilayer structure via the connector.

34. The integrated multilayer structure of claim 12, wherein one or more dimensions of a surface area or cross-sectional area of the connector facing the substrate film are larger than the diameter of the at least one through-hole so that the connector does not fully fit through said at least one through-hole.

* * * * *